(12) United States Patent
Matsuura et al.

(10) Patent No.: US 12,394,605 B2
(45) Date of Patent: Aug. 19, 2025

(54) PLASMA PROCESSING SYSTEM AND EDGE RING REPLACEMENT METHOD

(71) Applicant: Tokyo Electron Limited, Tokyo (JP)

(72) Inventors: Shin Matsuura, Miyagi (JP); Kenichi Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/398,162

(22) Filed: Dec. 28, 2023

(65) Prior Publication Data

US 2024/0136158 A1 Apr. 25, 2024
US 2024/0234102 A9 Jul. 11, 2024

Related U.S. Application Data

(63) Continuation of application No. 17/190,447, filed on Mar. 3, 2021, now Pat. No. 11,901,163.

(30) Foreign Application Priority Data

Mar. 3, 2020 (JP) .................................. 2020-035948
Oct. 23, 2020 (JP) .................................. 2020-178354

(51) Int. Cl.
*H01J 37/32* (2006.01)
*H01L 21/683* (2006.01)
*H01L 21/687* (2006.01)

(52) U.S. Cl.
CPC .. *H01J 37/32642* (2013.01); *H01J 37/32715* (2013.01); *H01L 21/6831* (2013.01); *H01L 21/68735* (2013.01); *H01L 21/68742* (2013.01)

(58) Field of Classification Search
CPC .......... H01J 37/32642; H01J 37/32715; H01L 21/68742; H01L 21/6875
See application file for complete search history.

(56) References Cited

U.S. PATENT DOCUMENTS

| 11,393,710 B2 | 7/2022 | Rice et al. |
| 11,901,163 B2* | 2/2024 | Matsuura .......... H01J 37/32715 |
| 2013/0048217 A1 | 2/2013 | Shiraiwa |
| 2016/0211166 A1 | 7/2016 | Yan et al. |

(Continued)

FOREIGN PATENT DOCUMENTS

| JP | 2011-054933 A | 3/2011 |
| JP | 2016-146472 A | 8/2016 |

(Continued)

*Primary Examiner* — Jose R Diaz
(74) *Attorney, Agent, or Firm* — XSENSUS LLP

(57) ABSTRACT

A plasma processing system includes a control device. The control device executes raising a lifter to deliver a cover ring supporting an edge ring to the lifter; moving a jig supported by a holder to a space between the cover ring and a substrate support surface/an annular support surface; raising a different lifter to deliver the jig to the different lifter; extracting the holder, and then moving the lifter and the different lifter relatively to deliver the edge ring to the jig; lowering only the lifter to deliver the cover ring to the annular member support surface; moving the holder to a space between the cover ring and the jig, and then lowering the different lifter to deliver the jig to the holder; and extracting the holder from the processing chamber to transfer the jig supporting the edge ring from the processing chamber.

24 Claims, 26 Drawing Sheets

(56) References Cited

U.S. PATENT DOCUMENTS

2017/0263478 A1\* 9/2017 McChesney et al. .. H01J 37/20
2021/0066052 A1\* 3/2021 Emura .............. H01L 21/68742
2022/0328290 A1 10/2022 Mishra et al.

FOREIGN PATENT DOCUMENTS

| JP | 2007-123810 A | 5/2017 |
| JP | 2019505088 A | 2/2019 |
| JP | 2019114790 A | 7/2019 |
| JP | 2020-17590 A | 1/2020 |
| WO | 2017131927 A1 | 8/2017 |
| WO | 2020/036613 A1 | 2/2020 |

\* cited by examiner

PLASMA PROCESSING SYSTEM AND EDGE RING REPLACEMENT METHOD

CROSS-REFERENCE TO RELATED APPLICATIONS

This application is a continuation application of U.S. application Ser. No. 17/190,447, filed Mar. 3, 2021, which claims priority to Japanese Patent Application Nos. 2020-035948 and 2020-178354, respectively filed on Mar. 3, 2020 and Oct. 23, 2020, the entire contents of each are incorporated herein by reference.

TECHNICAL FIELD

Exemplary embodiments of the present disclosure relate to a plasma processing system and an edge ring replacement method.

BACKGROUND

Japanese Patent Application Publication No. 2011-54933 discloses a substrate processing apparatus in which a substrate is disposed in a processing chamber, a focus ring is disposed to surround the substrate, and plasma processing is performed on the substrate. The substrate processing apparatus includes a substrate support having a susceptor including a substrate support surface on which the substrate is placed and a focus ring support surface on which the focus ring is placed, and a plurality of positioning pins. Each positioning pin having a pin shape is made of a material expandable in a radial direction by heating. The positioning pin is attached to the focus ring to protrude from a lower surface of the focus ring and inserted into a positioning hole formed in the focus ring support surface of the susceptor. Accordingly, the positioning pin is expanded in the radial direction by heating and fitted into the positioning hole, thus allowing a position of the focus ring to be aligned. Further, the substrate processing apparatus disclosed in Japanese Patent Application Publication No. 2011-54933 includes lifter pins and a transfer arm. The lifter pins are provided in the substrate support so as to protrude beyond and retract below the focus ring support surface, and configured to lift the focus ring together with respective positioning pins to separate the focus ring from the focus ring support surface. The transfer arm is provided outside the processing chamber and configured to exchange, in between the transfer arm and the lifter pin(s), the focus ring equipped with the positioning pins through a loading/unloading port provided at the processing chamber.

SUMMARY

The present disclosure provides a technique of selectively performing a replacement in a state where an edge ring is supported by a cover ring and a replacement of the edge ring alone when the edge ring is replaced in a plasma processing system in which both the edge ring and the cover ring are used.

In accordance with an aspect of the present disclosure, there is provided a plasma processing system including: a plasma processing device including a substrate support and a pressure-reducible processing chamber in which the substrate support is provided, the plasma processing device being configured to perform plasma processing on a substrate on the substrate support; a transfer device having a holder configured to support the substrate, the transfer device being configured to insert or extract the holder into or from the processing chamber to load or unload the substrate into or from the processing chamber; and a control device. Further, the substrate support includes a substrate support surface on which the substrate is placed, an annular member support surface on which a cover ring, covering an outer surface of an edge ring disposed to surround the substrate placed on the substrate support surface, is placed in a state where the cover ring supports the edge ring, a lifter configured to be vertically moved to protrude beyond a portion of the annular member support surface that overlaps the cover ring in a plan view, an elevating mechanism configured to raise or lower the lifter, a different lifter configured to be vertically moved to protrude beyond the substrate support surface, and a different elevating mechanism configured to raise or lower the different lifter. Further, the holder of the transfer device is configured to support the cover ring supporting the edge ring and a jig having a portion longer than an inner diameter of the edge ring. The control device controls the elevating mechanism, the transfer device, and the different elevating mechanism to execute: raising the lifter to deliver the cover ring supporting the edge ring from the annular member support surface to the lifter; moving the jig supported by the holder to a space between the cover ring supporting the edge ring and the substrate support surface/ the annular member support surface; raising the different lifter to deliver the jig from the holder to the different lifter; extracting the holder, and then moving the lifter and the different lifter relatively with each other to deliver the edge ring from the cover ring to the jig; lowering only the lifter to deliver the cover ring from the lifter to the annular member support surface; moving the holder to a space between the cover ring and the jig supporting the edge ring, and then lowering the different lifter to deliver the jig supporting the edge ring from the different lifter to the holder; and extracting the holder from the processing chamber to transfer the jig supporting the edge ring from the processing chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

Exemplary Embodiments

Figure 1:
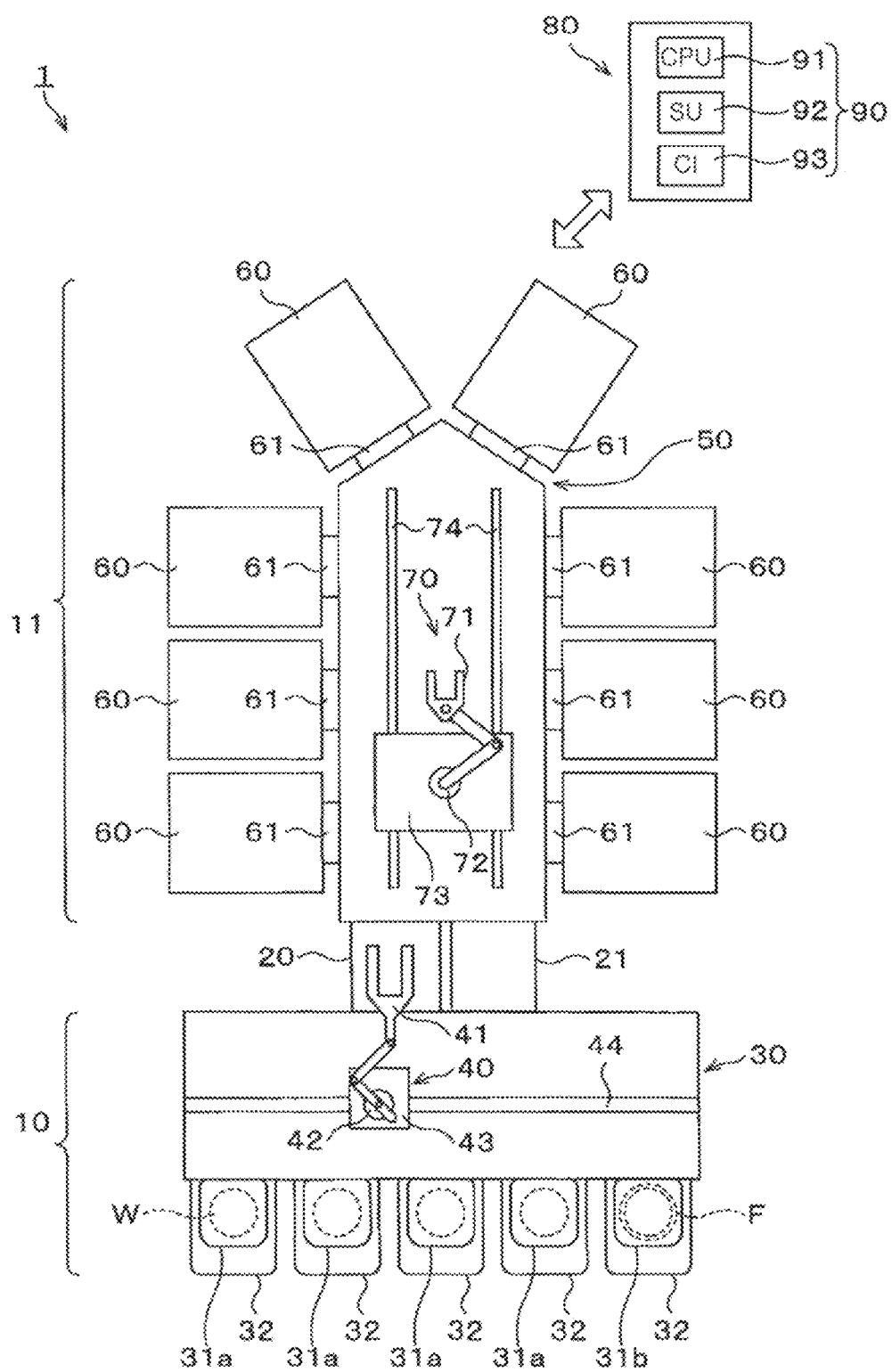
FIG. 1 is a plan view illustrating a schematic configuration of a plasma processing system according to a first exemplary embodiment.

In a manufacturing process of a semiconductor device or the like, a substrate such as a semiconductor wafer (hereinafter, referred to as a "wafer") is subjected to plasma processing such as etching or film formation using plasma. The plasma processing is performed in a state where the wafer is placed on a substrate support provided in a pressure-reducible processing chamber.

Further, in order to obtain good and uniform processing results in a central portion and a peripheral edge portion of the substrate during the plasma processing, an annular member referred to as an edge ring or a focus ring may be disposed to surround a periphery of the substrate on the substrate support. When an edge ring is used, the edge ring is accurately positioned and disposed so that a uniform processing result can be obtained in a circumferential direction at the peripheral edge portion of the substrate. For example, in Japanese Patent Application Publication No. 2011-54933, the edge ring is positioned using a positioning pin that is attached to the edge ring to protrude from a lower surface of the edge ring and is inserted into a positioning hole formed in an edge ring support surface.

When the edge ring is consumed, replacement of the edge ring is generally performed by an operator. However, it is also considered to replace the edge ring using a transfer device for transferring the edge ring. For example, in Japanese Patent Application Publication No. 2011-54933, the edge ring is replaced using both a lifter pin(s) and a transfer arm. The lifter pin is provided to protrude beyond or retract below the edge ring support surface of a substrate support and lifts the edge ring to separate the edge ring from the edge ring support surface, and the transfer arm performs the loading and unloading of both the wafer and the edge ring into and from the processing chamber.

However, when the edge ring is replaced using the transfer device, if a transfer accuracy of the edge ring is low, a portion of the edge ring may be caught on a substrate support surface of the substrate support, and thus the edge ring may not be appropriately placed on the edge ring support surface of the substrate support. For example, in a case where the difference between an inner diameter of the edge ring and a diameter of the substrate support surface is smaller than the transfer accuracy (transfer error) of the edge ring, when a position of the substrate support surface is higher than a position of the edge ring support surface, an inner side of the edge ring may be caught on the substrate support surface, and thus the edge ring may not be placed on the edge ring support surface.

Further, during the plasma processing, an annular member referred to as a cover ring that covers a circumferential outer surface of the edge ring may be disposed. In this case as well, if the transfer device is used to replace the cover ring, the cover ring may not be properly and accurately placed on a support surface for the cover ring.

Therefore, in a technique according to the exemplary embodiments, the annular member is positioned to be appropriately placed on the support surface for the annular member in the substrate support regardless of the transfer accuracy of the annular member.

Hereinafter, the substrate support, a plasma processing system, and an edge ring replacement method according to the exemplary embodiments will be described with reference to the drawings. Throughout the present specification and the drawings, like reference numerals will be given to like parts having substantially the same functions, and redundant description thereof will be omitted.

First Exemplary Embodiment

FIG. 1 is a plan view illustrating a schematic configuration of a plasma processing system according to a first exemplary embodiment.

In a plasma processing system 1 of FIG. 1, for example, a wafer W that is a substrate is subjected to plasma processing such as etching, film formation, and diffusion using plasma.

As illustrated in FIG. 1, the plasma processing system 1 has an atmospheric section 10 and a decompression section 11, and the atmospheric section 10 and the decompression section 11 are integrally connected to each other via load lock modules 20 and 21. The atmospheric section 10 includes an atmospheric module that performs the desired processing on the wafer W under an atmospheric pressure atmosphere. The decompression section 11 includes a decompression module that performs the desired processing on the wafer W in a pressure-reduced atmosphere.

The load lock modules 20 and 21 are connected to a loader module 30 to be described later of the atmospheric section 10 and a transfer module 50 to be described later of the decompression section 11 through gate valves (not illustrated). The load lock modules 20 and 21 are configured to temporarily hold the wafer W. Further, each of the load lock modules 20 and 21 is configured such that an inner space thereof can be switched between an atmospheric pressure atmosphere and a pressure-reduced atmosphere (vacuum atmosphere).

The atmospheric section 10 includes the loader module 30 having a transfer device 40 to be described later, and load ports 32 in which Front Opening Unified Pods (FOUPs) 31a and 31b are mounted thereon. Each FOUP 31a is configured to store a plurality of wafers W, and the FOUP 31b is configured to store a plurality of edge rings F. Moreover, an orienter module (not illustrated) that adjusts horizontal orientations of the wafer W and the edge ring F, and/or a storage module (not illustrated) that stores, for example, the plurality of wafers W may be provided to be adjacent to the loader module 30.

The loader module 30 includes a rectangular housing, and the inside of the housing is maintained in an atmospheric pressure atmosphere. A plurality of load ports 32, for example, five load ports 32, are disposed side by side on one side surface forming a long side of the housing of the loader module 30. The load lock modules 20 and 21 are disposed side by side on the other side surface forming the long side of the housing of the loader module 30.

The transfer device 40 configured to transfer the wafer W and the edge ring F is provided inside the loader module 30. The transfer device 40 has a transfer arm 41 that supports and moves the wafer W or the edge ring F, a rotor 42 that rotatably supports the transfer arm 41, and a base 43 on which the rotor 42 is placed. Further, a guide rail 44 extending in a longitudinal direction of the loader module 30 is provided inside the loader module 30. The base 43 is provided on the guide rail 44, and the transfer device is configured to be movable along the guide rail 44.

The decompression section 11 has a transfer module 50 configured to transfer the wafer W or the edge ring F, and a processing module 60 serving as a plasma processing device that is configured to perform the desired plasma processing on the wafer W transferred from the transfer module 50. The inside of each of the transfer module 50 and the processing module 60 is maintained in a pressure-reduced atmosphere. A plurality of processing modules 60, for example, eight processing modules, are provided for one transfer module 50. The number and arrangement of the processing modules 60 are not limited to the first exemplary embodiment and may be arbitrarily set as long as at least one processing module that requires replacement of the edge ring F is provided.

The inside of the transfer module 50 is formed with a polygonal (pentagonal shape in the illustrated example) housing, and the transfer module 50 is connected to the load lock modules 20 and 21 as described above. The transfer module 50 is configured to transfer the wafer W loaded into the load lock module 20 to one processing module 60, and transfer the wafer W subjected to the desired plasma processing in the processing module 60 to the atmospheric section 10 via the load lock module 21. Further, the transfer module 50 is configured to transfer the edge ring F loaded into the load lock module 20 to one processing module 60, and transfer the edge ring F that is a replacement target in the processing module 60 to the atmospheric section 10 via the load lock module 21.

For example, the processing module 60 performs plasma processing such as etching, film formation, and diffusion on the wafer W using plasma. For the processing module 60, a module that performs the desired plasma processing can be arbitrarily selected. Further, the processing module 60 is connected to the transfer module 50 through a gate valve 61. A configuration of the processing module 60 will be described later.

A transfer device 70 that is configured to transfer the wafer W or the edge ring F is provided inside the transfer module 50. The transfer device 70 includes a transfer arm 71 serving as a holder that supports and moves the wafer W or the edge ring F, a rotor 72 that rotatably supports the transfer arm 71, and a base 73 on which the rotor 72 is placed. Further, guide rails 74 that extend in a longitudinal direction of the transfer module 50 are provided inside the transfer module 50. The base 73 is provided on the guide rails 74, and the transfer device 70 is configured to be movable along the guide rails 74.

In the transfer module 50, the wafer W or the edge ring F held in the load lock module 20 is received by the transfer arm 71 and transferred into the processing module 60. Further, the wafer W or the edge ring F held in the processing module 60 is received by the transfer arm 71 and loaded into the load lock module 21.

Further, the plasma processing system 1 has a control device 80. In one embodiment, the control device 80 processes computer-executable instructions for causing the plasma processing system 1 to perform various processes described in the present disclosure. The control device 80 may be configured to control the respective components of the plasma processing system 1 to perform the various processes described herein. In one embodiment, the control device 80 may be partially or entirely included within the components of the plasma processing system 1. For example, the control device 80 may include a computer 90. For example, the computer 90 may include a processing unit (central processing unit (CPU)) 91, a storage unit (SU) 92, and a communication interface (CI) 93. The processing unit 91 may be configured to perform various control operations based on a program stored in the storage unit 92. The storage unit 92 may include a random access memory (RAM), a read only memory (ROM), a hard disk drive (HDD), a solid state drive (SSD), or a combination thereof. The communication interface 93 may communicate with the components of the plasma processing system 1 via a communication line such as a local area network (LAN).

Next, wafer processing performed using the plasma processing system 1 configured as described above will be described.

First, the wafer W is extracted from a desired FOUP 31a by the transfer device 40 and loaded into the load lock module 20. When the wafer W is loaded into the load lock module 20, the inside of the load lock module 20 is sealed and a pressure therein is reduced. Thereafter, the inside of the load lock module 20 and the inside of the transfer module 50 communicate with each other.

Next, the wafer W is held by the transfer device 70 and transferred from the load lock module 20 to the transfer module 50.

Next, the gate valve 61 is opened, and the wafer W is loaded into a desired processing module 60 by the transfer device 70. Thereafter, the gate valve 61 is closed, and the wafer W is subjected to the desired processing in the processing module 60. The processing performed on the wafer W in the processing module 60 will be described later.

Next, the gate valve 61 is opened, and the wafer W is unloaded from the processing module 60 by the transfer device 70. Thereafter, the gate valve 61 is closed.

Next, the wafer W is loaded into the load lock module 21 by the transfer device 70. When the wafer W is loaded into the load lock module 21, the inside of the load lock module 21 is sealed and exposed to the atmosphere. Thereafter, the inside of the load lock module 21 and the inside of the loader module 30 communicate with each other.

Next, the wafer W is held by the transfer device 40, transferred from the load lock module 21 to the desired FOUP 31a via the loader module 30, and accommodated in the desired FOUP 31a. With the above procedure, a series of wafer processing in the plasma processing system 1 is completed.

Moreover, the transfer of the edge ring between the FOUP 31b and the desired processing module 60 at the time of replacing the edge ring is performed in the same manner as the transfer of the wafer between the FOUP 31a and the desired processing module 60 at the time of the above-described wafer processing.

Figure 2:
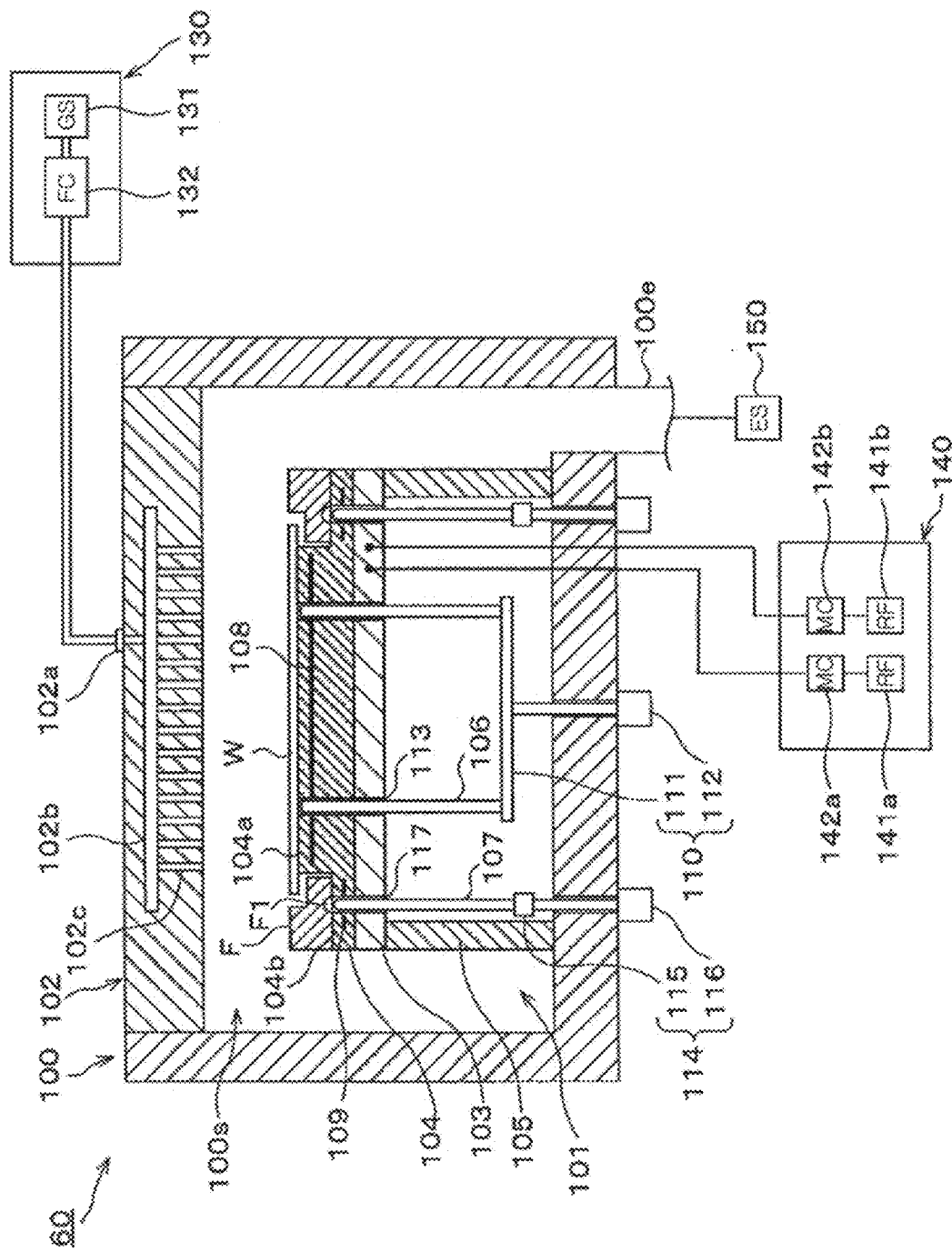
FIG. 2 is a vertical cross-sectional view illustrating a schematic configuration of a processing module of FIG. 1.
Figure 3:
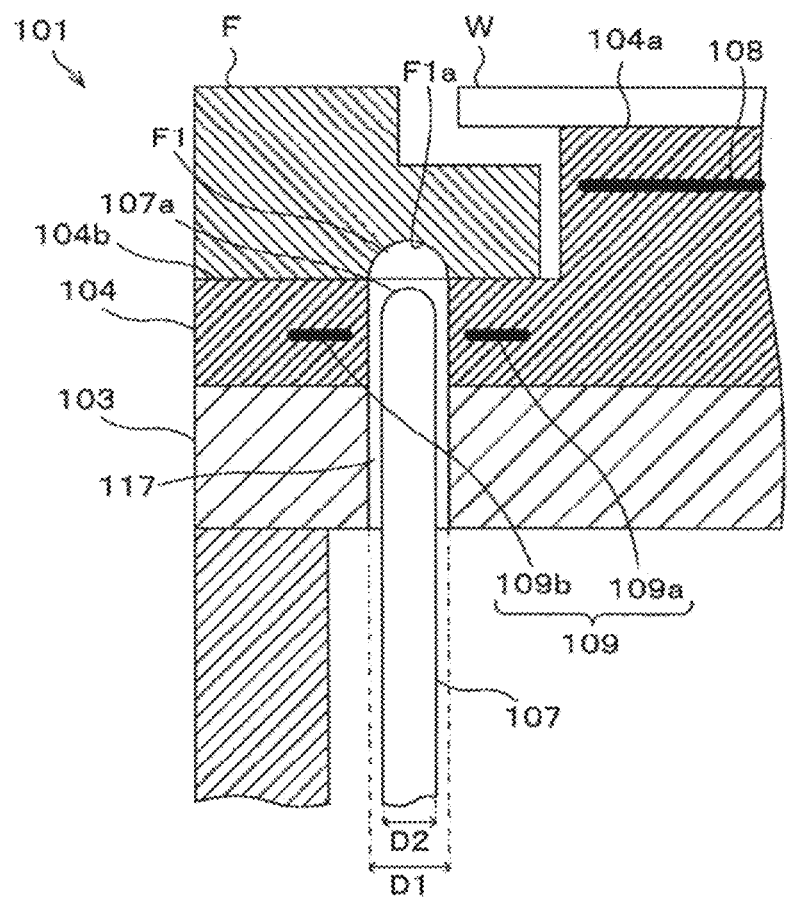
FIG. 3 is a partially enlarged view of FIG. 2.
Figure 4:
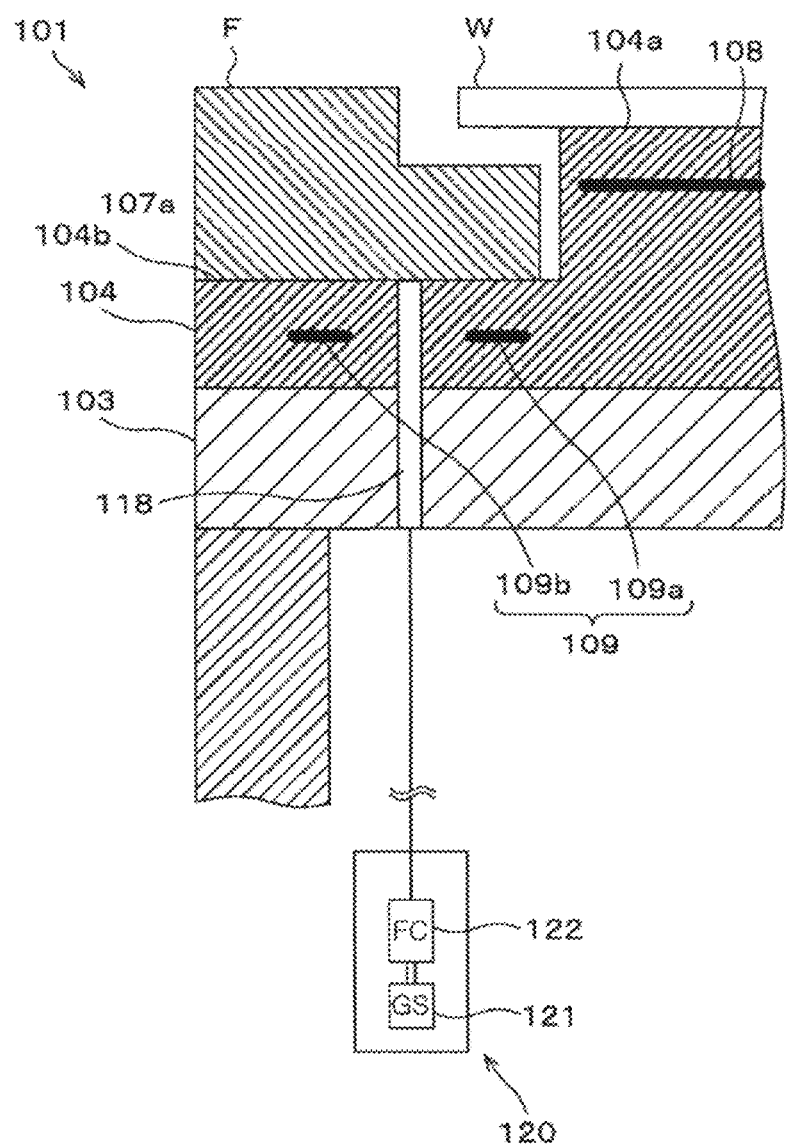
FIG. 4 is a partial cross-sectional view of a portion different from FIG. 2 in a circumferential direction of a wafer support.

Next, the processing module 60 will be described with reference to FIGS. 2 to 4. FIG. 2 is a vertical cross-sectional view illustrating a schematic configuration of the processing module 60. FIG. 3 is a partially enlarged view of FIG. 2. FIG. 4 is a partial cross-sectional view of a portion different from FIG. 2 in a circumferential direction of a wafer support 101 to be described later.

As illustrated in FIG. 2, the processing module 60 includes a plasma processing chamber 100 serving as a processing chamber, a gas supply unit 130, a radio frequency (RF) power supply unit 140, and an exhaust system (ES) 150. Moreover, the processing module 60 also includes a gas supply unit 120 to be described later (see, e.g., FIG. 4). Further, the processing module 60 includes a wafer support 101 serving as a substrate support and a shower head 102 serving as an upper electrode.

The wafer support 101 is disposed in a lower region of a plasma processing space 100s in the pressure-reducible plasma processing chamber 100. The shower head 102 is disposed above the wafer support 101 and may function as a portion of a ceiling of the plasma processing chamber 100.

The wafer support 101 is configured to support the wafer W in the plasma processing space 100s. In one embodiment, the wafer support 101 includes a lower electrode 103, an electrostatic chuck 104, an insulator 105, elevating pins 106, and elevating pins 107. Although not illustrated, in one embodiment, the wafer support 101 may include a temperature control module configured to adjust at least one of the electrostatic chuck 104 and the wafer W to a target temperature. The temperature control module may include a heater, a flow path, or a combination thereof. A temperature control fluid such as a refrigerant or a heat transfer gas flows through the flow path.

The lower electrode 103 is made of, for example, a conductive material such as aluminum. In one embodiment, the temperature control module described above may be provided in the lower electrode 103.

The electrostatic chuck 104 is a member configured to attract and hold both the wafer W and the edge ring F by an electrostatic force, and is provided on the lower electrode 103. An upper surface 104a of a central portion of the electrostatic chuck 104 is formed to be higher than an upper surface of a peripheral edge portion 104b of the electrostatic chuck 104. The upper surface 104a of the central portion of the electrostatic chuck 104 serves as a substrate support surface on which the wafer W is placed, and the upper surface 104b of the peripheral edge portion of the electrostatic chuck 104 serves as an annular member support surface on which the edge ring F serving as an annular member is placed. The edge ring F is the annular member disposed to surround the wafer W placed on the upper surface 104a of the central portion of the electrostatic chuck 104.

An electrode 108 for attracting and holding the wafer W is provided in the central portion of the electrostatic chuck 104, and an electrode 109 for attracting and holding the edge ring F is provided in the peripheral edge portion of the electrostatic chuck 104. The electrostatic chuck 104 has a structure in which the electrodes 108 and 109 are interposed between insulators made of an insulating material.

A DC voltage from a DC power supply (not illustrated) is applied to the electrode 108. Accordingly, the wafer W is attracted and held onto the upper surface 104a of the central portion of the electrostatic chuck 104 by an electrostatic force thus generated. Similarly, a DC voltage from a DC power supply (not illustrated) is applied to the electrode 109. Accordingly, the edge ring F is attracted and held onto the upper surface 104b of the peripheral edge portion of the electrostatic chuck 104 by an electrostatic force thus generated. As illustrated in FIG. 3, the electrode 109 is a bipolar type electrode including a pair of electrodes 109a and 109b.

In the first exemplary embodiment, the central portion of the electrostatic chuck 104 having the electrode 108 and the peripheral edge portion of the electrostatic chuck having the electrode 109 are integrated with each other. However, the central portion and the peripheral edge portion may be separate bodies.

Further, in the first exemplary embodiment, the electrode 109 for attracting and holding the edge ring F is a bipolar type electrode. However, the electrode 109 may be a unipolar type electrode.

Further, for example, the central portion of the electrostatic chuck 104 is formed to have a diameter smaller than a diameter of the wafer W. Thus, as illustrated in FIG. 2, when the wafer W is placed on the upper surface 104a, the peripheral edge portion of the wafer W horizontally protrudes from the central portion of the electrostatic chuck 104.

Moreover, the edge ring F has a stepped portion formed on an upper portion thereof, and an upper surface of an outer peripheral portion of the edge ring F is formed to be higher than an upper surface of an inner peripheral portion thereof. The inner peripheral portion of the edge ring F is formed so as to enter an area below the peripheral edge portion of the wafer W horizontally protruding from the central portion of the electrostatic chuck 104. That is, an inner diameter of the edge ring F is formed to be smaller than an outer diameter of the wafer W.

The insulator 105 is a cylindrical member made of a ceramic or the like, and supports the electrostatic chuck 104.

For example, the insulator 105 is formed so as to have an outer diameter equal to an outer diameter of the lower electrode 103, and supports a peripheral edge portion of the lower electrode 103. Further, the insulator 105 is provided so that an inner peripheral surface of the insulator 105 is located outside an elevating mechanism 114 to be described later in a radial direction along the electrostatic chuck 104.

Each elevating pin 106 is a columnar member that is raised or lowered (vertically moved) to protrude beyond or retract below the upper surface 104a of the central portion of the electrostatic chuck 104. The elevating pin 106 is made of, for example, ceramic. Three or more elevating pins 106 are provided at intervals along a circumferential direction of the electrostatic chuck 104, that is, a circumferential direction of the upper surface 104a. For example, the elevating pins 106 are provided at equal intervals along the circumferential direction. The elevating pins 106 are provided so as to extend in an up-down direction.

The elevating pins 106 are connected to an elevating mechanism 110 that raises or lowers the elevating pins 106. For example, the elevating mechanism 110 has a support member 111 that supports the elevating pins 106, and a driving unit 112 that generates a driving force for raising or lowering the support member 111 to raise or lower the elevating pins 106. The driving unit 112 has a motor (not illustrated) that generates the driving force.

Each of the elevating pins 106 is inserted into a through-hole 113 which extends downward from the upper surface 104a of the central portion of the electrostatic chuck 104 to reach a bottom surface of the lower electrode 103. In other words, the through-hole 113 is formed through the central portion of the electrostatic chuck 104 and the lower electrode 103.

Each elevating pin 107 is a columnar member that is raised or lowered (vertically moved) to protrude beyond or retract below the upper surface 104b of the peripheral edge portion of the electrostatic chuck 104. The elevating pin 107 is formed of, for example, alumina, quartz, SUS, or the like. Three or more elevating pins 107 are provided at intervals along the circumferential direction of the electrostatic chuck 104, that is, the circumferential direction of the upper surface 104b of the peripheral edge portion. For example, the elevating pins 107 are provided at equal intervals along the circumferential direction. The elevating pins 107 are provided so as to extend in the up-down direction.

Moreover, for example, a thickness of each of the elevating pins 107 in a range from 1 mm to 3 mm.

The elevating pins 107 are connected to an elevating mechanism 114 that drives the elevating pins 107. For example, the elevating mechanism 114 is provided for each elevating pin 107 and has a support member 115 that movably supports the elevating pin 107 in a horizontal direction. For example, the support member 115 has a thrust bearing in order to movably support the elevating pin 107 in the horizontal direction. Further, the elevating mechanism 114 has a driving unit 116 that generates a driving force for raising or lowering the support member 115 to raise or lower the elevating pin 107. The driving unit 116 has a motor (not illustrated) that generates the driving force.

The elevating pin 107 is inserted into a through-hole 117 which extends downward from the upper surface 104b of the peripheral edge portion of the electrostatic chuck 104 to reach the bottom surface of the lower electrode 103. In other words, the through-hole 117 is formed through the peripheral edge portion of the electrostatic chuck 104 and the lower electrode 103.

The through-hole 117 is formed to have positioning accuracy at least larger than a transfer accuracy (transfer error) of the edge ring with the transfer device 70. In other words, the size of the through-hole 117 is formed to be larger than the transfer error of the edge ring with the transfer device 70.

Except for an upper end portion of the elevating pin 107, the elevating pin 107 is formed in, for example, a columnar shape, and the upper end portion is formed in a hemispherical shape that gradually tapers upward. The upper end portion of the elevating pin 107 comes into contact with the bottom surface of the edge ring F when the elevating pin 107 is raised to support the edge ring F. As illustrated in FIG. 3, for each of the elevating pins 107, a recess F1 formed with an upwardly recessed concave surface F1a is provided at a position corresponding to the elevating pin 107 on the bottom surface of the edge ring F.

In a plan view, a size D1 (opening diameter) of the recess F1 of the edge ring F is larger than a transfer accuracy (error) (±X µm) of the edge ring F with the transfer device 70 above the upper surface 104b of the electrostatic chuck 104 and larger than a size D2 of the upper end portion of the elevating pin 107. For example, a relationship of D1>D2 and D1>2X is satisfied, and D1 is about 0.5 mm. In another example, D1 may range from 0.5 mm to 3 mm.

Further, as described above, the upper end portion of the elevating pin 107 is formed in a hemispherical shape that gradually tapers upward, and a curvature of the concave surface F1a forming the recess F1 of the edge ring F is set to be smaller than a curvature of a convex surface (that is, the upper end surface) 107a forming the hemispherical shape of the upper end portion of the elevating pin 107. That is, the concave surface F1a has a radius of curvature larger than a radius of curvature of the convex surface 107a.

Moreover, for example, when a thickness of the outer peripheral portion of the edge ring F is in a range from 3 mm to 5 mm, a depth of the recess F1 is in a range from 0.5 mm to 1 mm.

Further, for example, Si or SiC is used as a material of the edge ring F.

Further, as illustrated in FIG. 4, a heat transfer gas supply path 118 is formed for the upper surface 104b of the peripheral edge portion of the electrostatic chuck 104. The heat transfer gas supply path 118 is provided to supply a heat transfer gas such as helium gas to the bottom surface of the edge ring F placed on the upper surface 104b. The heat transfer gas supply path 118 is provided to be in fluid communication with the upper surface 104b. Further, a side of the heat transfer gas supply path 118 opposite to the upper surface 104b is in fluid communication with the gas supply unit 120. The gas supply unit 120 may include one or more gas sources (GS) 121 and one or more flow controllers (FC) 122. In one embodiment, for example, the gas supply unit 120 is configured to supply a heat transfer gas from the gas source 121 to the heat transfer gas supply path via the flow controller 122. For example, each flow controller 122 may include a mass flow controller or a pressure-control type flow controller.

Although not illustrated, similarly, in order to supply a heat transfer gas to the bottom surface of the wafer W placed on the upper surface 104a, the heat transfer gas supply path 118 is also formed for the upper surface 104a of the central portion of the electrostatic chuck 104.

Further, a suction path for vacuum-attracting the edge ring F placed on the upper surface 104b of the peripheral edge portion of the electrostatic chuck 104 may be formed. For example, the suction path is provided in the electrostatic chuck 104 to be in fluid communication with the upper surface 104b. The heat transfer gas supply path and the suction path described above may be in common in whole or in part.

Referring back to FIG. 2, the shower head 102 serving as the upper electrode is configured to supply one or more processing gases from the gas supply unit 130 to the plasma processing space 100s. In one embodiment, the shower head 102 has a gas inlet 102a, a gas diffusion chamber 102b, and a plurality of gas outlets 102c. For example, the gas inlet 102a is in fluid communication with the gas supply unit 130 and the gas diffusion chamber 102b. The plurality of gas outlets 102c is in fluid communication with the gas diffusion chamber 102b and the plasma processing space 100s.

In one embodiment, the shower head 102 is configured to supply one or more processing gases from the gas inlet 102a to the plasma processing space 100s via the gas diffusion chamber 102b and the plurality of gas outlets 102c. The gas supply unit 130 may include one or more gas sources (GS) 131 and one or more flow controllers (FC) 132. In one embodiment, for example, the gas supply unit 130 is configured to supply one or more processing gases from the corresponding gas sources 131 to the gas inlet 102a via the corresponding flow controllers 132. For example, each flow controller 132 may include, e.g., a mass flow controller or a pressure-control type flow controller. Further, the gas supply unit 130 may include one or more flow modulation devices for modulating or pulsating a gas flow of one or more processing gases.

The RF power supply unit 140 is configured to supply RF power, for example, one or more RF signals, to one or more electrodes such as the lower electrode 103, the shower head 102, or both the lower electrode 103 and the shower head 102. Therefore, plasma is generated from one or more processing gases supplied to the plasma processing space 100s. Accordingly, the RF power supply unit 140 may function as at least a part of a plasma generation unit configured to generate plasma from one or more processing gases in the plasma processing chamber. For example, the RF power supply unit 140 includes two RF generation units (RF) 141a and 141b and two matching circuits (MC) 142a and 142b. In one embodiment, the RF power supply unit 140 is configured to supply a first RF signal from a first RF generation unit (RF) 141a to the lower electrode 103 via a first matching circuit 142a. For example, the first RF signal may have a frequency in a range of 27 MHz to 100 MHz.

Further, in one embodiment, the RF power supply unit 140 is configured to supply a second RF signal from a second RF generation unit (RF) 141b to the lower electrode 103 via a second matching circuit 142b. For example, the second RF signal may have a frequency in a range of 400 kHz to 13.56 MHz. Alternatively, a direct current (DC) pulse generation unit may be used instead of the second RF generation unit 141b.

Further, although not illustrated, other embodiments may be considered in the present disclosure. For example, in an alternative embodiment, the RF power supply unit 140 may be configured to supply the first RF signal from the RF generation unit to the lower electrode 103, the second RF signal from another RF generation unit to the lower electrode 103, a third RF signal from still another RF generation unit to the lower electrode 103. In addition, in another alternative embodiment, a DC voltage may be applied to the shower head 102.

Further, in various embodiments, amplitudes of one or more RF signals (that is, first RF signal, second RF signal, and the like) may be pulsated or modulated. The amplitude modulation may include pulsating the RF signal amplitude between an ON state and an OFF state, or between two or more different ON states.

The exhaust system 150 may be connected to, for example, an exhaust port 100e disposed at a bottom of the plasma processing chamber 100. The exhaust system 150 may include a pressure valve and a vacuum pump. The vacuum pump may include a turbo molecular pump, a roughing pump or a combination thereof.

Next, an example of wafer processing performed using the processing module 60 configured as described above will be described. Moreover, the processing module 60 performs processing such as etching, film formation, and diffusion on the wafer W.

First, the wafer W is loaded into the plasma processing chamber 100, and the wafer W is placed on the electrostatic chuck 104 by raising or lowering (vertically moving) the elevating pins 106. Thereafter, a DC voltage is applied to the electrode 108 of the electrostatic chuck 104, and thus the wafer W is electrostatically attracted and held on the electrostatic chuck 104 by an electrostatic force. Further, after the wafer W is loaded, the pressure in the plasma processing chamber 100 is reduced to a predetermined vacuum level by the exhaust system 150.

Next, the processing gas is supplied from the gas supply unit 130 to the plasma processing space 100s via the shower head 102. Further, RF power HF for plasma generation is supplied from the RF power supply unit 140 to the lower electrode 103, and thus the processing gas is excited to generate plasma. Further, RF power LF for ion introduction may be supplied from the RF power supply unit 140. Then, the wafer W is subjected to plasma processing by the action of the generated plasma.

During the plasma processing, the heat transfer gas such as He gas or Ar gas is supplied to the bottom surface of the wafer W and the bottom surface of the edge ring F, which are attracted and held on the electrostatic chuck 104, through the heat transfer gas supply path 118 or the like.

In order to end the plasma processing, the supply of the heat transfer gas to the bottom surface of the wafer W may be stopped. Further, the supply of the RF power HF from the RF power supply unit 140 and the supply of the processing gas from the gas supply unit 130 are stopped. When the RF power LF is supplied during the plasma processing, the supply of the RF power LF is also stopped. Next, the attraction and holding of the wafer W on the electrostatic chuck 104 is stopped.

Thereafter, the wafer W is raised by the elevating pins 106 and separated from the electrostatic chuck 104. During the separation, charge neutralization of the wafer W may be performed. Then, the wafer W is unloaded from the plasma processing chamber 100, and a series of wafer processing is completed.

Moreover, the edge ring F is attracted and held by the electrostatic force during the wafer processing, and specifically, the edge ring F is attracted and held by the electrostatic force even during the plasma processing and before and after the plasma processing. Before and after the plasma processing, different voltages are applied to the electrodes 109a and 109b such that a potential difference is generated between the electrode 109a and the electrode 109b. The edge ring F is attracted and held by an electrostatic force caused by the potential difference. In contrast, during the plasma processing, the same voltage (for example, the same positive voltage) is applied to the electrode 109a and the electrode 109b, and a potential difference is generated between the electrode 109a/the electrode 109b and the edge ring F having a ground potential through the plasma. The edge ring F is attracted and held by an electrostatic force caused by the potential difference. Moreover, while the edge ring F is attracted and held by the electrostatic force, the elevating pins 107 are retracted below the upper surface 104*b* of the peripheral edge portion of the electrostatic chuck 104.

As described above, since the edge ring F is attracted and held by the electrostatic force, there is no misalignment between the edge ring F and the electrostatic chuck 104 when the supply of the heat transfer gas to the bottom surface of the edge ring F is started.

Figure 5:
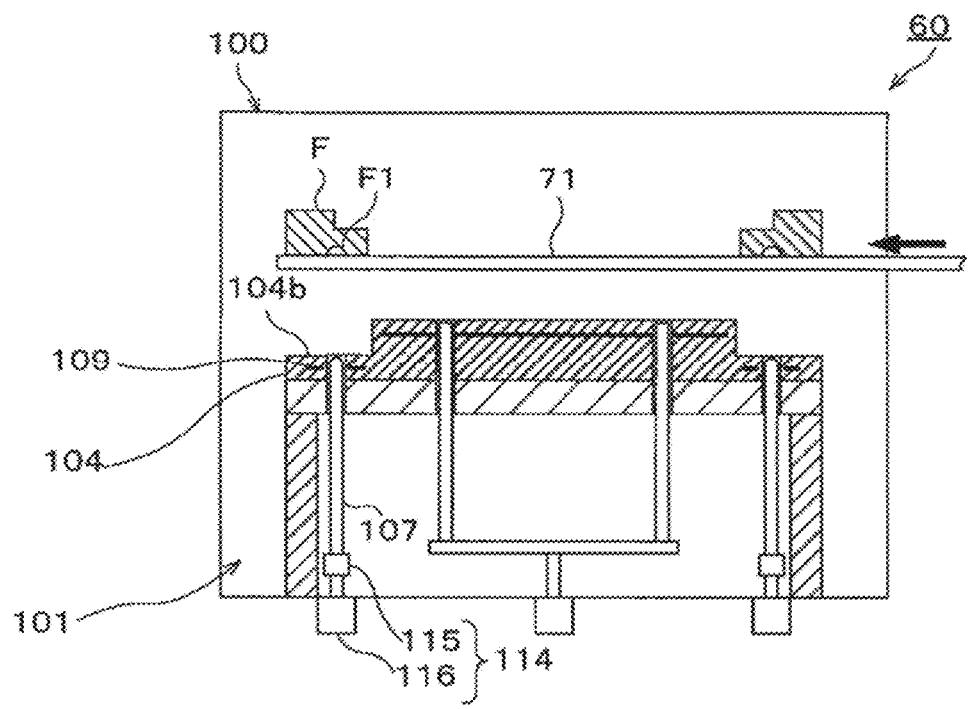
FIG. 5 is a view schematically illustrating a state in the processing module during a process of placing an edge ring.
Figure 6:
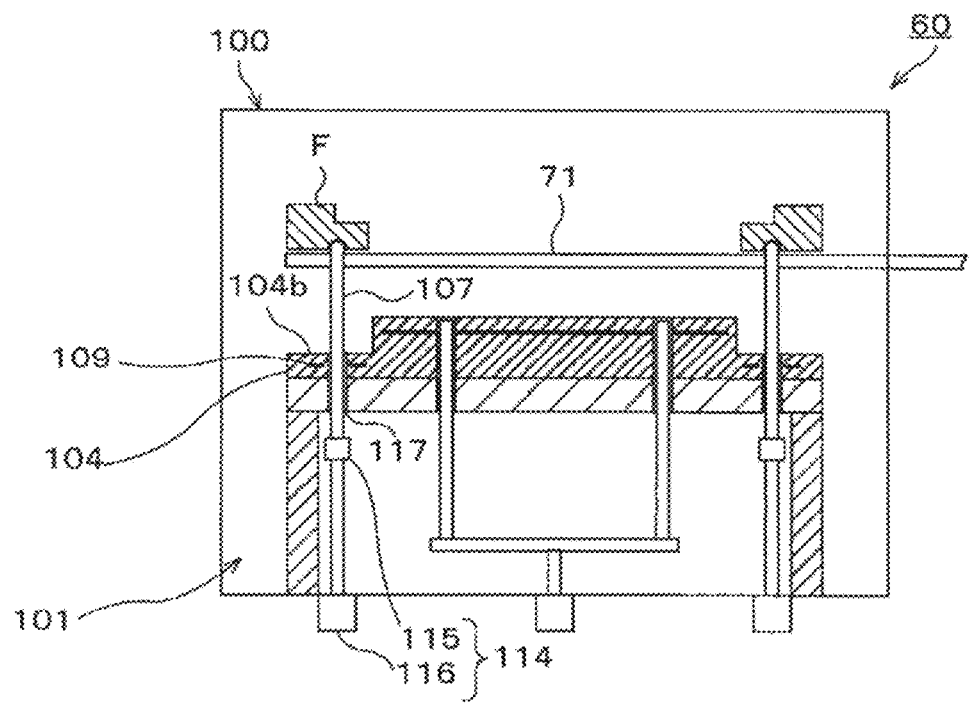
FIG. 6 is a view schematically illustrating a state in the processing module during the process of placing the edge ring.
Figure 7:
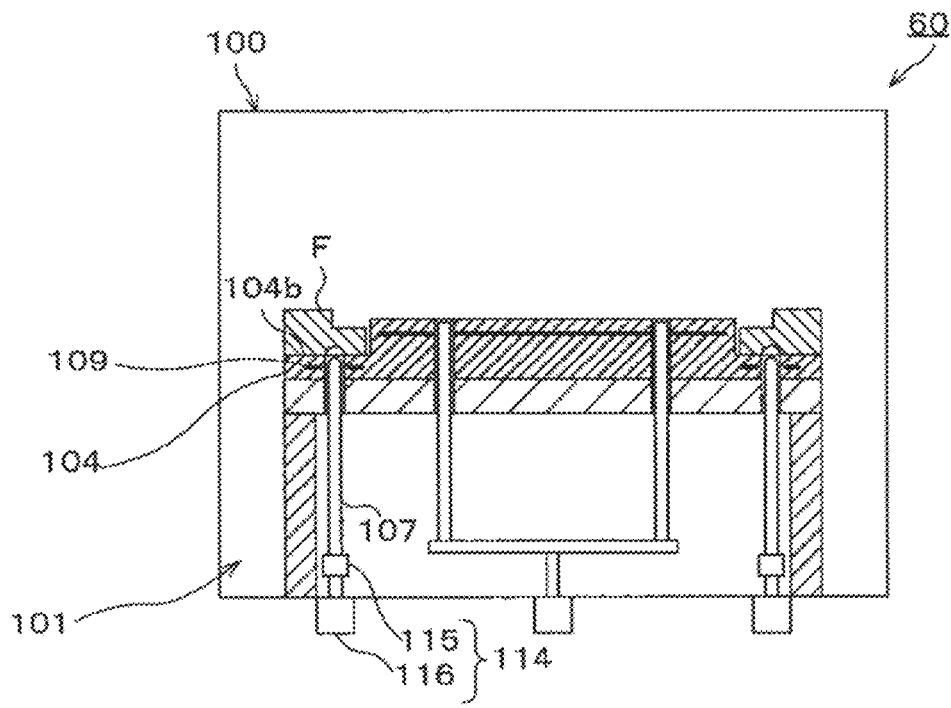
FIG. 7 is a view schematically illustrating a state in the processing module during the process of placing the edge ring.

Next, an example of a process of placing the edge ring F in the processing module 60, which is performed using the above-described plasma processing system 1, will be described with reference to FIGS. 5 to 7. FIGS. 5 to 7 are views schematically illustrating a state in the processing module 60 during the placement process. Moreover, the following process is performed under the control of the control device 80. Further, for example, the following process is performed in a state where a temperature of the electrostatic chuck 104 is room temperature.

First, in the plasma processing system 1, the transfer arm 71 holding the edge ring F is inserted from the transfer module 50 having a vacuum atmosphere into the pressure-reduced plasma processing chamber 100 of the processing module 60 in which the edge ring F is to be placed, through a loading/unloading port (not illustrated). Then, as illustrated in FIG. 5, the edge ring F held by the transfer arm 71 is transferred above the upper surface 104*b* of the peripheral edge portion of the electrostatic chuck 104. The edge ring F is held by the transfer arm 71 while a circumferential orientation thereof is adjusted.

Next, all the elevating pins 107 are raised, and the edge ring F is delivered from the transfer arm 71 to the elevating pins 107 as illustrated in FIG. 6. Specifically, all the elevating pins 107 are raised, and the upper end portion of each elevating pin 107 comes into contact with the bottom surface of the edge ring F held by the transfer arm 71. In this case, the upper end portion of the elevating pin 107 enters the recess F1 provided in the bottom surface of the edge ring F. This is because, as described above, for each of the elevating pins 107, the recess F1 is provided at a position corresponding to the elevating pin 107 on the bottom surface of the edge ring F, and in a plan view, the size of the recess F1 is larger than the transfer accuracy (transfer error) of the edge ring F with the transfer device 70 and larger than the size of the upper end portion of the elevating pin 107. When the elevating pins 107 are continuously raised even after the upper end portions of the elevating pins 107 are in contact with the bottom surface of the edge ring F, the edge ring F is delivered to the elevating pins 107 and supported by the elevating pins 107 as illustrated in FIG. 6.

Moreover, as described above, the curvature of the concave surface F1*a* forming the recess F1 of the edge ring F is set to be smaller than the curvature of the convex surface 107*a* forming the hemispherical shape of the upper end portion of each elevating pin 107. Therefore, the edge ring F moves as follows and is positioned with respect to the elevating pin 107 even if the position of the edge ring F with respect to the elevating pin 107 is misaligned immediately after delivery to the elevating pin 107. That is, the edge ring F relatively moves with respect to the concave surface F1*a* so that a top of the upper end portion of the elevating pin 107 slides on the concave surface F1*a* of the edge ring F. Then, the edge ring F stops moving at a point where a center of the recess F1 and a center of the upper end portion of the elevating pin 107 coincide with each other in a plan view.

That is, the edge ring F stops moving at a point where a deepest portion of the recess F1 and the top of the upper end portion of the elevating pin 107 coincide with each other in a plan view, and the edge ring F is positioned with respect to the elevating pin 107 at that position.

Moreover, in order to promote the movement for the positioning after the edge ring F is delivered to the elevating pins 107, each elevating pin 107 may be finely moved up and down, or each elevating pin 107 may be lowered at different speeds or at a high speed.

After the edge ring F is positioned with respect to the elevating pin 107, the transfer arm 71 is extracted from the plasma processing chamber 100 and the elevating pins 107 are lowered. Thus, the edge ring F is placed on the upper surface 104*b* of the peripheral edge portion of the electrostatic chuck 104 as illustrated in FIG. 7.

The edge ring F is positioned with respect to each elevating pin 107 as described above, and further because the through-hole 117 and the elevating pin 107 are provided with respect to the center of the electrostatic chuck 104 with high accuracy, the edge ring F is placed on the upper surface 104*b* in a state of being positioned with respect to the center of the electrostatic chuck 104.

Moreover, for example, the elevating pin 107 is lowered until the upper end surface of the elevating pin 107 is retracted below the upper surface 104*b* of the peripheral edge portion of the electrostatic chuck 104.

Thereafter, a DC voltage from a DC power supply (not illustrated) is applied to the electrode 109 provided in the peripheral edge portion of the electrostatic chuck 104, and the edge ring F is attracted and held onto the upper surface 104*b* by an electrostatic force generated by the DC voltage. Specifically, different voltages are applied to the electrode 109*a* and the electrode 109*b*, and the edge ring F is attracted and held onto the upper surface 104*b* by an electrostatic force according to a potential difference thus generated.

With the above procedure, a series of processes of placing the edge ring F is completed.

When the above-described suction path is provided, after the edge ring F is placed on the upper surface 104*b*, vacuum-attraction may be performed on the upper surface 104*b* using the suction path before being attracted and held by the electrostatic force. Then, after switching from the vacuum-attraction using the suction path to the attraction and holding using the electrostatic force, a vacuum level of the suction path is measured, and based on the measurement result, it may be determined whether to place the edge ring F on the upper surface 104*b* again.

A process of removing the edge ring F is performed in a reverse procedure of the process of placing the edge ring F described above.

Moreover, when the edge ring F is removed, the edge ring F may be cleaned first and unloaded from the plasma processing chamber 100.

As described above, the wafer support 101 according to the first exemplary embodiment includes the upper surface 104*a* on which the wafer W is placed, the upper surface 104*b* on which the edge ring F, which is disposed to surround the wafer W held on the upper surface 104*a*, is placed, three or more elevating pins 107 that are raised or lowered to protrude beyond or retract below the upper surface 104*b*, and the elevating mechanism 114 that raises or lowers the elevating pins 107. Further, for each of the elevating pins 107, the recess F1 having the concave surface F1*a* recessed upward is provided at a position corresponding to the elevating pin 107 on the bottom surface of the edge ring F. Then, in a plan view, the recess F1 is formed so that the size of the recess F1 is larger than the transfer error of the edge ring F above the upper surface 104b and larger than the size of the upper end portion of the elevating pin 107. Therefore, when the elevating pin 107 is raised and comes into contact with the bottom surface of the edge ring F, the upper end portion of the elevating pin 107 can be accommodated in the recess F1 of the edge ring F. Further, in the first exemplary embodiment, the upper end portion of the elevating pin 107 is formed in a hemispherical shape that gradually tapers upward, and the curvature of the concave surface F1a of the recess F1 is smaller than the curvature of the convex surface of the hemispherical shape of the upper end portion of the elevating pin 107. Therefore, when the edge ring F is supported by the elevating pin 107, the edge ring F can be positioned with respect to the elevating pin 107 at the position where the deepest portion of the recess F1 and the top of the upper end portion of the elevating pin 107 coincide with each other in a plan view. Accordingly, when the elevating pin 107 supporting the edge ring F is lowered, the elevating pin 107 can be positioned with respect to the electrostatic chuck 104 and the edge ring F is placed on the upper surface 104b. That is, according to the first exemplary embodiment, the edge ring F can be positioned and placed on the wafer support 101 regardless of the transfer accuracy of the edge ring F.

Further, when the wafer support 101 according to the first exemplary embodiment is provided in the plasma processing device, the edge ring F can be replaced using the transfer device 70 without the intervention of an operator. When the operator replaces the edge ring, it is necessary to expose the processing chamber in which the edge ring is disposed to the atmosphere. However, when the wafer support 101 according to the first exemplary embodiment is provided, since the edge ring F can be replaced using the transfer device 70, it is not necessary to expose the plasma processing chamber 100 to the atmosphere at the time of the replacement. Therefore, according to the first exemplary embodiment, the time required for replacement can be significantly shortened. Further, in the first exemplary embodiment, since three or more elevating pins are provided, in addition to the positional alignment of the edge ring F in a radial direction (direction from the center of the wafer support 101 toward an outer periphery), the positional alignment of the edge ring F in a circumferential direction can be performed.

Further, in the first exemplary embodiment, the elevating mechanism 114 is provided for each elevating pin 107, and further has the support member 115 that movably supports the elevating pin 107 in the horizontal direction. Therefore, when the electrostatic chuck 104 is thermally expanded or contracted, the elevating pin 107 can be moved in the horizontal direction in response to the thermal expansion or contraction. Therefore, when the electrostatic chuck 104 is thermally expanded or contracted, the elevating pin 107 is not damaged.

Further, in the first exemplary embodiment, after the edge ring F is placed, the electrode 109 is used to attract and hold the edge ring F by an electrostatic force. Therefore, it is not necessary to provide a protrusion or a recess on the bottom surface of the edge ring F or the support surface (upper surface 104b of the electrostatic chuck 104) of the edge ring F for suppressing the misalignment of the placed edge ring F. In particular, since it is not necessary to provide the protrusions or the like on the upper surface 104b of the electrostatic chuck 104, it is possible to suppress the complexity of a configuration of the electrostatic chuck 104.

Moreover, in the first exemplary embodiment, since there is no other member between the electrostatic chuck 104 of the wafer support 101 and the edge ring F, a cumulative tolerance is small.

Figure 8:
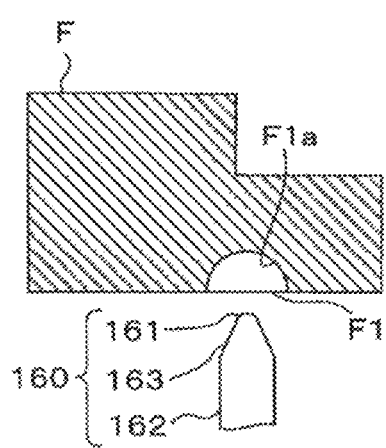
FIG. 8 is a view for describing another example of an elevating pin.

FIG. 8 is a view for describing another example of the elevating pin.

An elevating pin 160 of FIG. 8 has a columnar portion 162 and a connection portion 163 in addition to an upper end portion 161 formed in a hemispherical shape.

The columnar portion 162 is formed in a columnar shape thicker than the upper end portion 161. Specifically, for example, the columnar portion 162 is formed in a cylindrically columnar shape thicker than the upper end portion 161.

The connection portion 163 is a portion that connects the upper end portion 161 and the columnar portion 162. This connection portion is formed in a truncated cone shape that gradually tapers upward. Specifically, for example, the connection portion is formed in a truncated cone shape whose lower end has the same diameter as that of the columnar portion 162 and whose upper end has the same diameter as that of the upper end portion 161.

By using the elevating pin 160, positioning accuracy of the edge ring F with respect to the elevating pin 160 can be further improved.

Moreover, by using the elevating pin 160 described above, the recess F1 can be made shallower, and thus the edge ring F can be made thinner and lighter.

Figure 9:
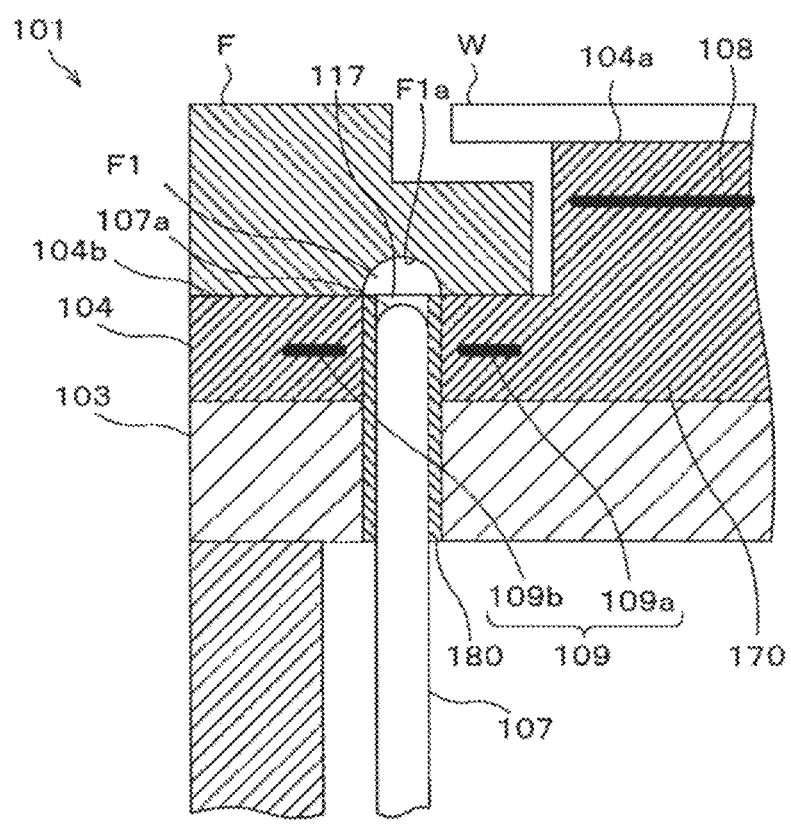
FIG. 9 is a view for describing another example of an electrostatic chuck.

FIG. 9 is a view for describing another example of the electrostatic chuck.

An electrostatic chuck 170 of FIG. 9 includes an insulating guide 180 in the through-hole 117 through which the elevating pin 107 is inserted.

For example, the guide 180 is a cylindrical member made of resin, and is fitted into the through-hole 117.

In the electrostatic chuck 170, the elevating pin 107 is inserted into the guide 180 provided in the through-hole 117, and a moving direction of the elevating pin 107 when the elevating pin 107 is raised or lowered is defined in the up-down direction by the guide 180. Therefore, the upper end portion of the elevating pin 107 is more accurately positioned with respect to the electrostatic chuck 170. Accordingly, in the state where the edge ring F is supported by the elevating pin 107 after the positioning of the edge ring F is performed, when the elevating pin 107 is lowered to be placed on the upper surface 104b of the electrostatic chuck 170, the edge ring F can be placed on the upper surface 104b in a state where the edge ring F is positioned more accurately with respect to the electrostatic chuck 170.

Second Exemplary Embodiment

Figure 10:
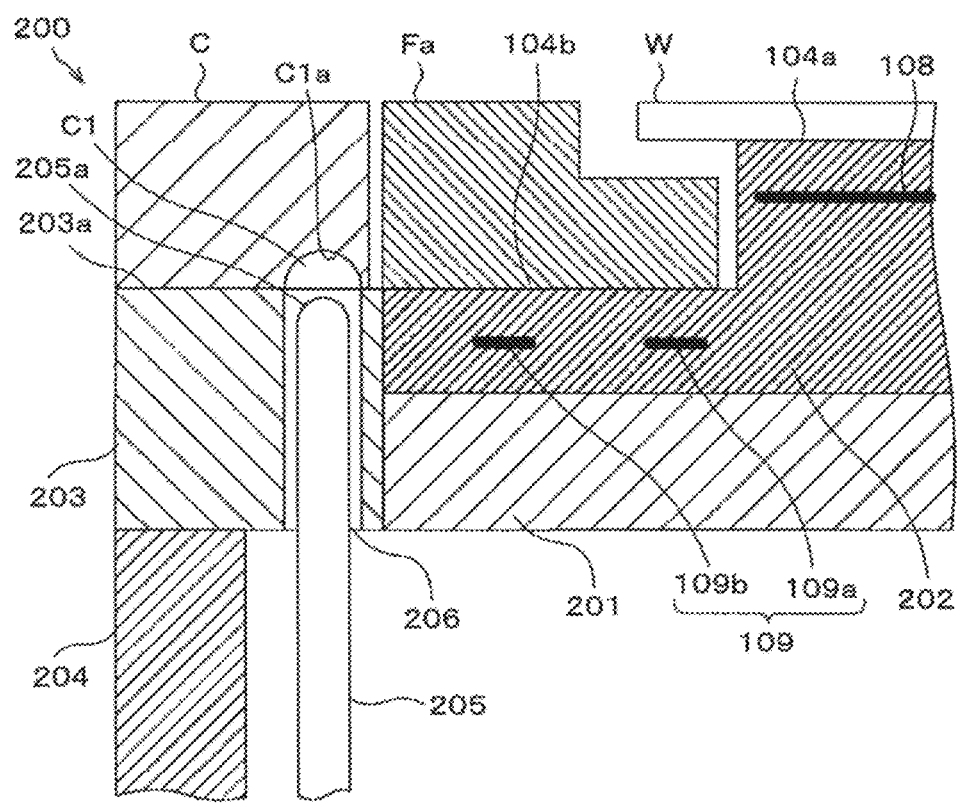
FIG. 10 is a partially enlarged cross-sectional view illustrating a schematic configuration of a wafer support that is a substrate support according to a second exemplary embodiment.

FIG. 10 is a partially enlarged cross-sectional view illustrating a schematic configuration of a wafer support 200 serving as a substrate support according to a second exemplary embodiment.

In the first exemplary embodiment, the edge ring F is the replacement target. However, in the second exemplary embodiment, a cover ring C is the replacement target. The cover ring C is an annular member that covers an outer surface of the edge ring F in the circumferential direction.

The wafer support 200 of FIG. 10 has a lower electrode 201, an electrostatic chuck 202, a support 203, an insulator 204, and an elevating pin 205.

In the lower electrode 103 and the electrostatic chuck 104 illustrated in FIG. 2 or the like, the through-hole 117 that extends through the lower electrode 103 and the electrostatic chuck 104 is provided. However, the through-hole 117 is not provided in the lower electrode 201 and the electrostatic chuck 202. In this respect, the lower electrode 201 and the electrostatic chuck 202 are different from the lower electrode 103 and the electrostatic chuck 104.

For example, the support 203 is a member that is made of quartz and formed in an annular shape in a plan view. The support 203 supports the lower electrode 201 and the cover ring C. An upper surface 203a of the support 203 becomes an annular member support surface on which the cover ring C that is the annular member to be replaced is placed.

The insulator 204 is a cylindrical member made of a ceramic or the like. The insulator 204 supports the support 203. For example, the insulator 204 is formed to have an outer diameter equal to an outer diameter of the support 203, and supports a peripheral edge portion of the support 203.

While the elevating pin 107 of FIG. 2 or the like is inserted through the through-hole 117 extending through the lower electrode 103 and the electrostatic chuck 104, the elevating pin 205 is inserted through a through-hole 206 extending through the support 203 from the upper surface 203a in the up-down direction. In this respect, the elevating pin 205 is different from the elevating pin 107. Meanwhile, similar to the elevating pin 107, three or more elevating pins 205 are provided at intervals along a circumferential direction of the electrostatic chuck 202.

Further, similar to the elevating pin 107, the elevating pin 205 is formed in a hemispherical shape of which an upper end portion gradually tapers upward. The upper end portion of the elevating pin 205 comes into contact with a bottom surface of the cover ring C when the elevating pin 205 is raised to support the cover ring C. Further, for each elevating pin 205, a recess C1 having an upwardly recessed concave surface C1a is provided at a position corresponding to the elevating pin 205 on the bottom surface of the cover ring C.

In a plan view, a size of the recess C1 of the cover ring C is larger than the transfer accuracy (transfer error) of the cover ring C with the transfer device 70 and larger than a size of the upper end portion of the elevating pin 205.

Further, as described above, the upper end portion of the elevating pin 205 is formed in a hemispherical shape that gradually tapers upward, and a curvature of the concave surface C1a of the recess C1 of the cover ring C is set to be smaller than a curvature of a convex surface 205a of the hemispherical shape of the upper end portion of the elevating pin 205.

Processes of placing and removing the cover ring C are the same as the processes of placing and removing the edge ring F according to the first exemplary embodiment, and thus descriptions thereof will be omitted.

Moreover, the elevating pin 107 for the edge ring F illustrated in FIG. 2 or the like is configured to protrude beyond or retract below the upper surface 104b of the peripheral edge portion of the electrostatic chuck 104. Then, when the edge ring F is attracted and held by the electrostatic force, the upper end surface of the elevating pin 107 is retracted below the upper surface 104b of the peripheral edge portion of the electrostatic chuck 104. On the other hand, as long as the elevating pin 205 can protrude from the upper surface 203a of the support 203 and an amount of protrusion is adjustable, the elevating pin 205 may not be configured to protrude beyond or retract below the upper surface 203a of the support 203. Further, when the edge ring F is attracted and held by the electrostatic force, the upper end surface of the elevating pin 205 may protrude from the upper surface 203a of the support 203.

Third Exemplary Embodiment

Figure 11:
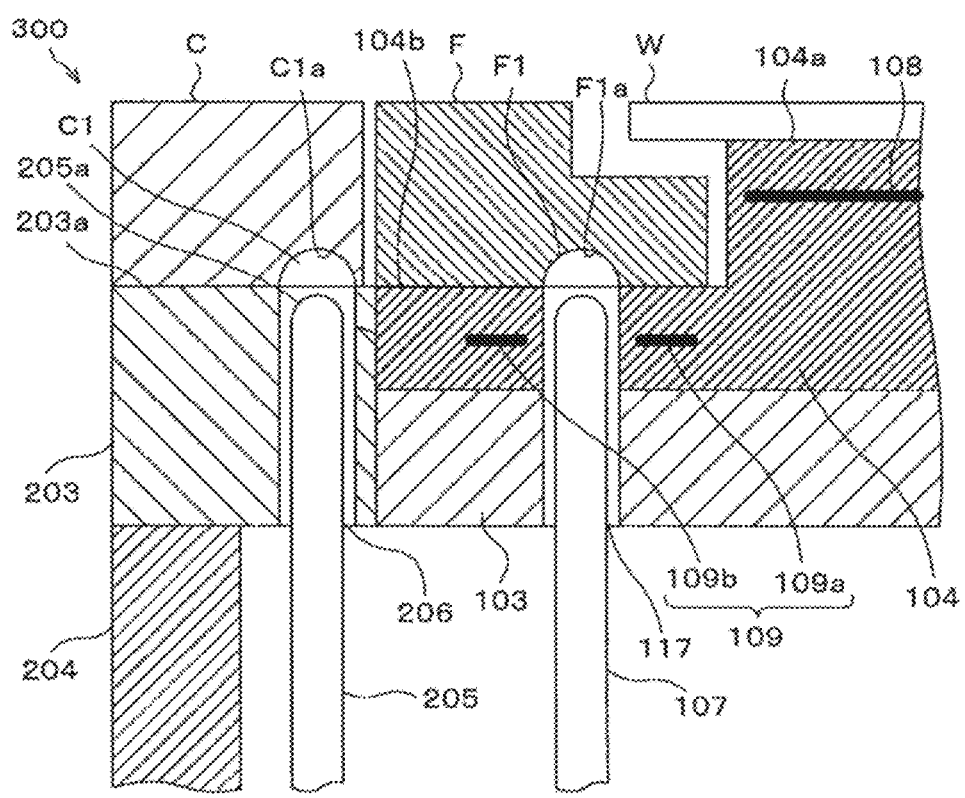
FIG. 11 is a partially enlarged cross-sectional view illustrating a schematic configuration of a wafer support that is a substrate support according to a third exemplary embodiment.

FIG. 11 is a partially enlarged cross-sectional view illustrating a schematic configuration of a wafer support 300 that is the substrate support according to a third exemplary embodiment.

In the first exemplary embodiment, the edge ring F is the replacement target, and in the second exemplary embodiment, the cover ring C is the replacement target. However, in the third exemplary embodiment, both the edge ring F and the cover ring C are the replacement targets.

In the third exemplary embodiment, the edge ring F and the cover ring C are replaced separately. Therefore, the elevating pin 107 and the through-hole 117 are provided for the edge ring F, and the elevating pin 205 and the through-hole 206 are provided for the cover ring C. Further, the above-described recesses F1 and C1 are formed on the bottom surface of the edge ring F and the bottom surface of the cover ring C, respectively.

In the third exemplary embodiment, processes of placing and removing the edge ring F and processes of placing and removing the cover ring C are the same as the processes of placing and removing the edge ring F according to the first exemplary embodiment, and thus descriptions thereof will be omitted.

Fourth Exemplary Embodiment

The edge ring F is the replacement target in the first exemplary embodiment, the cover ring C is the replacement target in the second exemplary embodiment, and both the edge ring F and the cover ring C are the replacement targets in the third exemplary embodiment. On the other hand, in the fourth exemplary embodiment, the cover ring supporting the edge ring or the edge ring alone is the replacement target.

That is, in the fourth exemplary embodiment, both the edge ring and the cover ring are used as described in the third exemplary embodiment. However, in a technique according to the fourth exemplary embodiment, when the edge ring is replaced in the plasma processing system in which both the edge ring and the cover ring are used, a replacement in a state where the edge ring is supported by the cover ring (that is, a replacement in a state where the edge ring is integrated with the cover ring), and a replacement of the edge ring alone are selectively performed.

Figure 12:
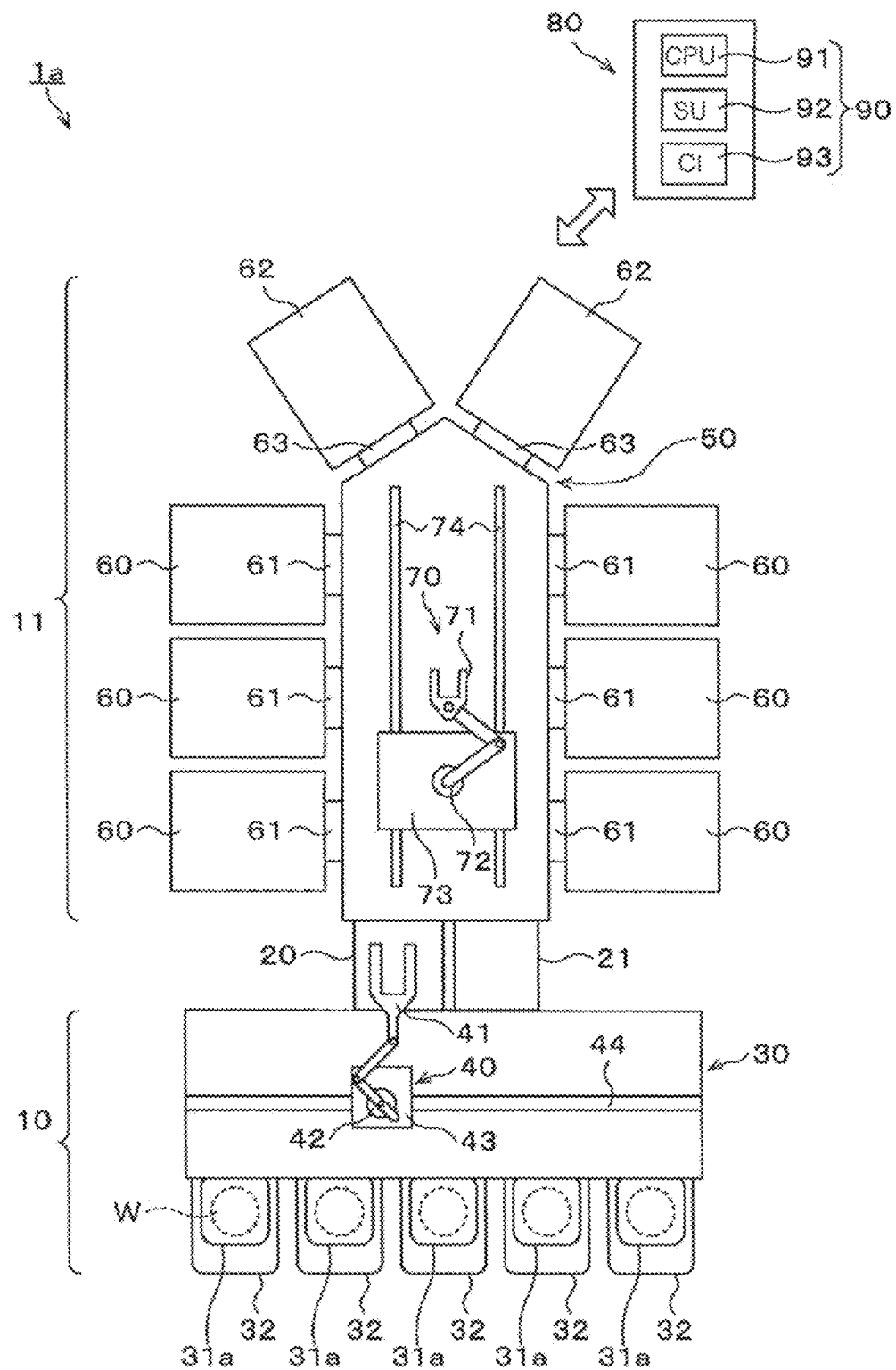
FIG. 12 is a plan view illustrating a schematic configuration of a plasma processing system according to a fourth exemplary embodiment.

FIG. 12 is a plan view illustrating a schematic configuration of a plasma processing system according to the fourth exemplary embodiment.

Unlike the plasma processing system 1 of FIG. 1, in a plasma processing system 1a of FIG. 12, the decompression section 11 includes a storage module 62 that stores at least one of jigs to be described later for replacing the cover ring supporting the edge ring and the edge ring alone, in addition to the transfer module 50 and the processing module 60.

In the example of FIG. 12, two storage modules 62 are provided for one transfer module 50. The cover ring supporting the edge ring is stored in at least one of the two storage modules 62, and the jig is stored in the other of the two storage modules 62. The number and arrangement of the storage modules 62 are not limited thereto and may be arbitrarily set as long as at least one storage module 62 is provided.

The storage module 62 is connected to the transfer module 50 through a gate valve 63. Then, the inside of the storage module 62 is also maintained in a pressure-reduced atmosphere similar to the insides of the transfer module 50 and the processing module 60.

In the transfer module 50 of the plasma processing system 1a, the cover ring supporting the edge ring or the jig stored in the storage module 62 is received by the transfer arm 71 and transferred to the processing module 60. Further, in the transfer module 50, the cover ring supporting the edge ring or the jig held in the processing module 60 is received by the transfer arm 71 and transferred to the storage module 62.

Further, the plasma processing system 1a of FIG. 12 and the plasma processing system 1 of FIG. 1 differ in the configuration of the wafer support that is the substrate support in the processing module 60.

Figure 13:
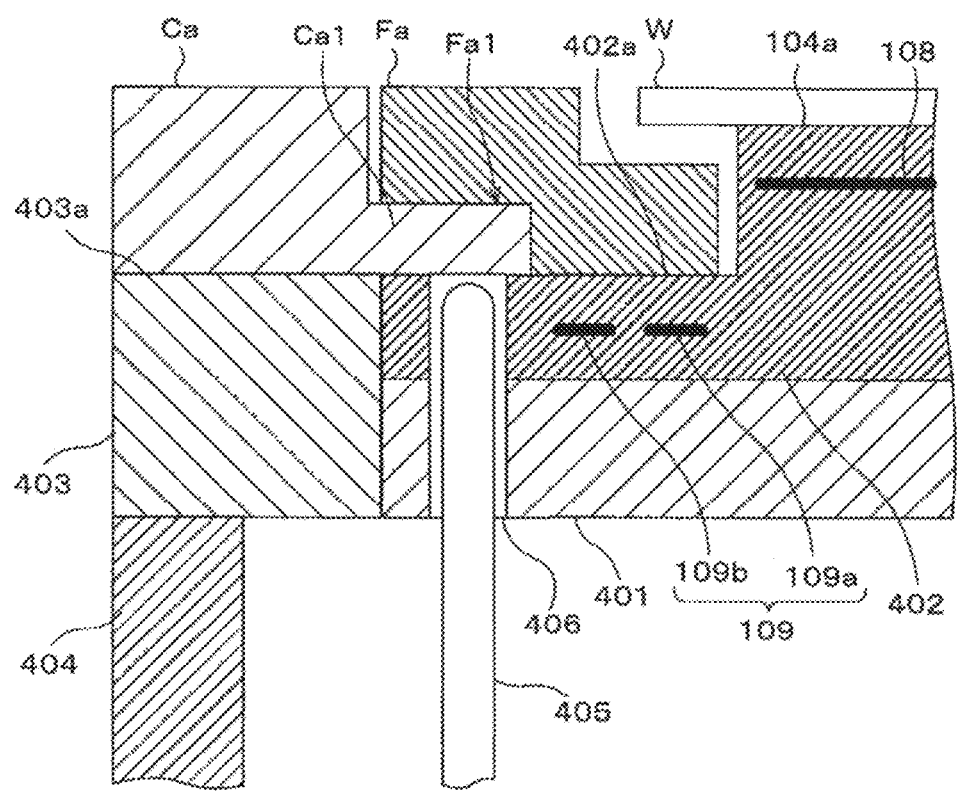
FIG. 13 is a partially enlarged cross-sectional view illustrating a schematic configuration of a wafer support that is a substrate support according to the fourth exemplary embodiment.

FIG. 13 is a partially enlarged cross-sectional view illustrating a schematic configuration of a wafer support 400 that is the substrate support according to the present embodiment.

The wafer support 400 of FIG. 13 includes a lower electrode 401, an electrostatic chuck 402, a support 403, an insulator 404, and a lifter 405.

The lower electrode 401 and the electrostatic chuck 402 include an insertion hole 406 through which the lifter 405 is inserted. For example, the insertion hole 406 is formed to extend downward from an upper surface 402a of a peripheral edge portion of the electrostatic chuck 402 and reach a bottom surface of the lower electrode 401.

Moreover, in the example of FIG. 13, the electrostatic chuck 402 includes a bipolar electrode 109 for attracting and holding an edge ring Fa. However, an electrode for attracting and holding the edge ring Fa may be a unipolar electrode. Alternatively, the electrode for attracting and holding the edge ring Fa may be omitted from the electrostatic chuck 402.

Further, when the electrostatic chuck includes the electrode for attracting and holding the edge ring Fa, in the electrostatic chuck, a peripheral edge portion where the electrode for attracting and holding the edge ring Fa is provided and a central portion where the electrode 108 for attracting and holding the wafer W is provided may be integrated with each other or may be separate bodies.

The support 403 is a member formed in an annular shape in a plan view using, for example, quartz, and supports the lower electrode 401.

An upper surface 403a of the support 403 and the upper surface 402a of the peripheral edge portion of the electrostatic chuck 402 become annular member support surfaces having thereon a cover ring Ca supporting the edge ring Fa, which is one of the annular members to be replaced according to the fourth exemplary embodiment.

The insulator 404 is a cylindrical member made of a ceramic or the like, and supports the support 403. For example, the insulator 404 is formed to have an outer diameter equal to an outer diameter of the support 403, and supports a peripheral edge portion of the support 403.

In the fourth exemplary embodiment, the cover ring Ca is configured to support the edge ring Fa, and is formed to at least partially overlap the edge ring Fa in a plan view. For example, the cover ring Ca supports the edge ring Fa in a state where the edge ring Fa is substantially concentric with the cover ring Ca. In one embodiment, a diameter of an innermost peripheral portion of the cover ring Ca is smaller than a diameter of an outermost peripheral portion of the edge ring Fa, and when the cover ring Ca and the edge ring Fa are disposed substantially concentrically, an inner peripheral portion of the cover ring Ca at least partially overlaps an outer periphery of the edge ring Fa in a plan view. For example, in one embodiment, the edge ring Fa has a concave portion Fa1 that is recessed inward in a radial direction on an outer peripheral portion of a bottom portion thereof, the cover ring Ca has a convex portion Ca1 that protrudes inward in the radial direction at a bottom portion thereof, and the edge ring Fa is supported by an engagement between the convex portion Ca1 and the concave portion Fa1.

Moreover, in the fourth exemplary embodiment, the edge ring Fa has a stepped portion formed on an upper portion thereof similar to the edge ring F shown in FIG. 2, an upper surface of an outer peripheral portion of the edge ring Fa is formed to be higher than an upper surface of an inner peripheral portion of the edge ring Fa, and an inner diameter of the edge ring Fa is smaller than the outer diameter of the wafer W.

Figure 14:
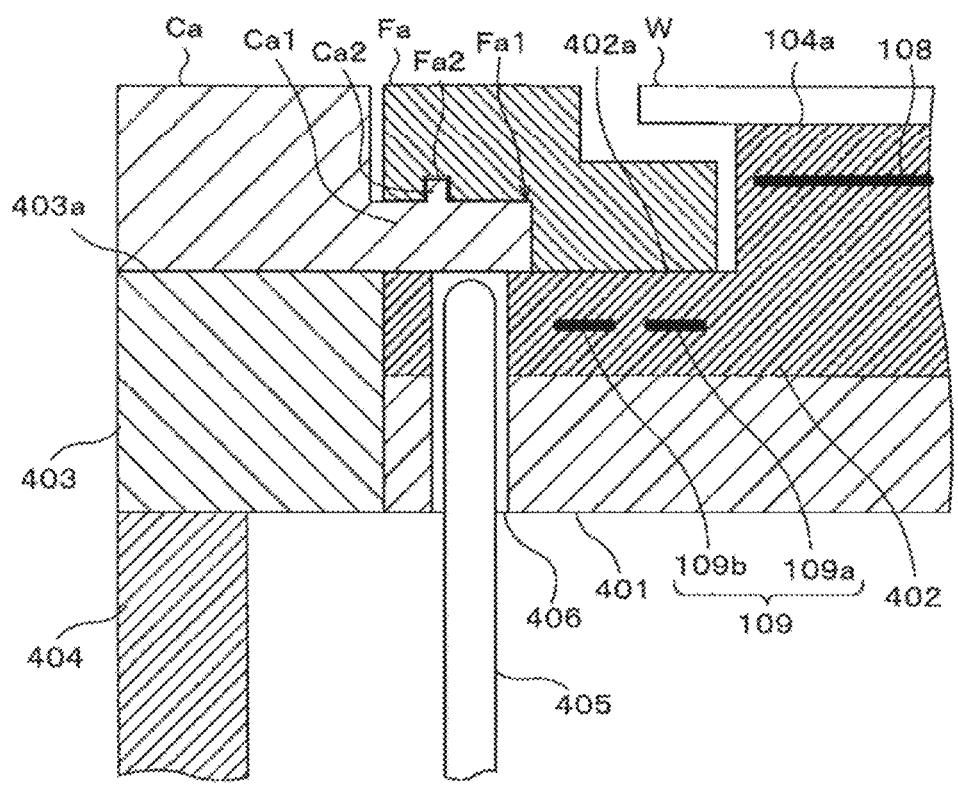
FIG. 14 is a partially enlarged cross-sectional view illustrating another example of a wafer support.

Further, in one embodiment, in order to suppress the misalignment between the cover ring Ca and the edge ring Fa, a protrusion may be provided in one of the cover ring Ca and the edge ring Fa, and a recess into which the protrusion is fitted may be provided in the other. Specifically, as illustrated in FIG. 14, an annular protrusion Ca2 concentric with the cover ring Ca may be formed on an upper surface of the cover ring Ca, and an annular recess Fa2 concentric with the edge ring Fa may be formed in a lower surface of the edge ring Fa at a position corresponding to the annular protrusion Ca2. By fitting the annular protrusion Ca2 into the annular recess Fa2, the misalignment between the cover ring Ca and the edge ring Fa can be suppressed. Further, instead of the above example, an annular recess may be formed in the upper surface of the cover ring Ca, an annular protrusion may be formed on the lower surface of the edge ring Fa, and by fitting the annular protrusion into the annular recess, the misalignment between the cover ring Ca and the edge ring Fa may be suppressed.

Moreover, the edge ring Fa may be an integrated body or two bodies (that is, may be divided into a plurality of members).

The lifter 405 is a member that is raised or lowered to protrude from a position overlapping the cover ring Ca on the upper surface 402a of the peripheral edge portion of the electrostatic chuck 402 in a plan view. When the lifter 405 is raised or lowered from the above position, the edge ring Fa can be raised and lowered by the lifter 405 while the cover ring Ca that supports the edge ring Fa is supported by the lifter 405. In one embodiment, the lifter 405 is a long columnar member, similar to the elevating pin 107 described above.

Further, when a jig to be described later is raised or lowered by an elevating pin 106 (see FIG. 16 to be described later), the lifter 405 is provided so as not to hinder the raising and lowering of the jig. Moreover, the elevating pin 106 is an example of a lifter for the wafer W that is raised or lowered to protrude beyond or retract below an upper surface (that is, substrate support surface) 104a of a central portion of the electrostatic chuck 402.

For example, the lifter 405 protrudes or retracts from a position corresponding to the convex portion Ca1 of the cover ring Ca on the upper surface 402a of the peripheral edge portion of the electrostatic chuck 402. The insertion hole 406 through which the lifter 405 is inserted is formed at a position corresponding to the convex portion Ca1 of the cover ring Ca. Moreover, in the example of FIG. 14, since the lifter 405 is the long columnar member, the insertion hole 406 extends through the electrostatic chuck 402 and the lower electrode 401. However, depending on a shape of the lifter 405, the insertion hole 406 may not extend through the electrostatic chuck 402 and the lower electrode 401.

Similar to the elevating pin 107 in FIG. 2, three or more lifters 405 are provided at intervals along a circumferential direction of the electrostatic chuck 402.

A lifting mechanism for raising and lowering the lifter 405 may be provided for each lifter 405, or a common lifting mechanism may be provided for the plurality of lifters 405.

Figure 15:
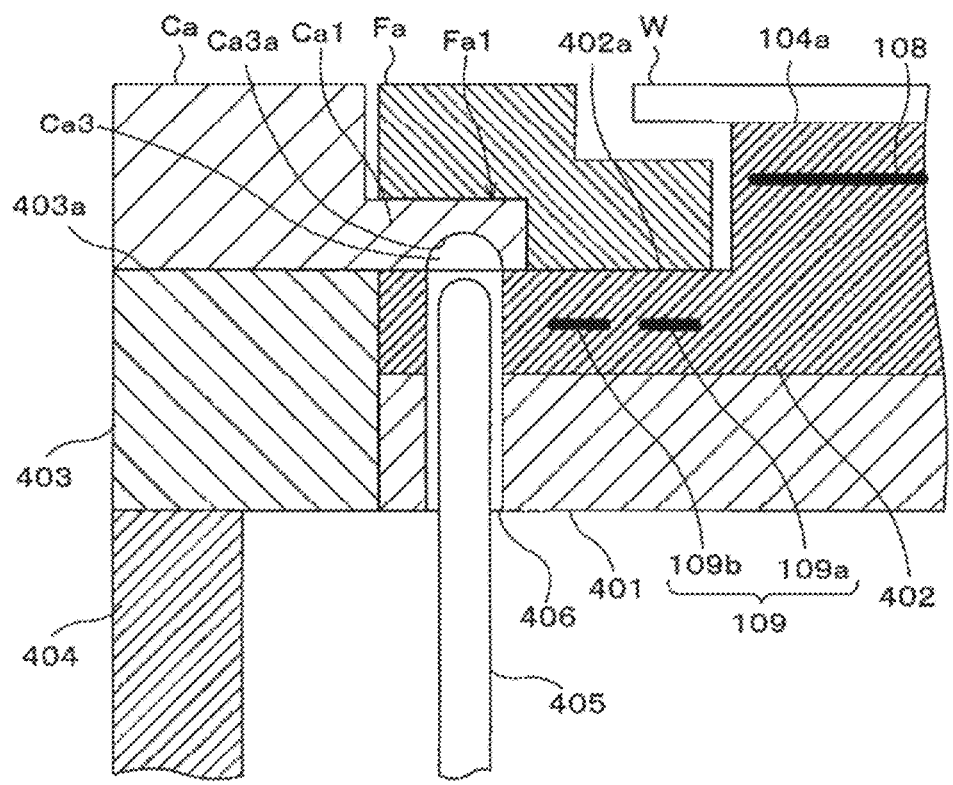
FIG. 15 is a partially enlarged cross-sectional view illustrating still another example of a wafer support.

Similar to the elevating pin 107, the lifter 405 may be formed in a hemispherical shape of which an upper end portion gradually tapers upward. For example, when the lifter 405 is raised, the upper end portion of the lifter 405 comes into contact with a bottom surface of the convex portion Ca1 of the cover ring Ca and supports the cover ring Ca that supports the edge ring Fa. As illustrated in FIG. 15, for each of the lifters 405, a recess Ca3 formed with a concave surface Ca3a recessed upward may be provided at a position corresponding to the lifter 405 on the bottom surface of the convex portion Ca1 of the cover ring Ca.

When the recess Ca3 is provided, for example, a size of the recess Ca3 is larger than the transfer accuracy (transfer error) of the cover ring Ca with the transfer device 70 and larger than a size of the upper end portion of the lifter 405 in a plan view.

Further, when the upper end portion of the lifter 405 is formed in a hemispherical shape that gradually tapers upward as described above, a curvature of the concave surface Ca3a forming the recess Ca3 may be set to be smaller than that of a convex surface 405a forming the hemispherical shape of the upper end portion of the lifter 405.

Next, an example of a process of placing the cover ring Ca supporting the edge ring Fa, which is performed using the plasma processing system 1a, will be described. Moreover, the following process is performed under the control of the control device 80.

First, in the plasma processing system 1a, the cover ring Ca supporting the edge ring Fa is held by the transfer arm 71 of the transfer module 50 having a vacuum atmosphere and extracted from the storage module 62. Next, the transfer arm 71 that holds the cover ring Ca supporting the edge ring Fa is inserted into the pressure-reduced plasma processing chamber 100 of the processing module 60 that is a placement target through the loading/unloading port (not illustrated). Then, the cover ring Ca supporting the edge ring Fa is transferred above the upper surface 402a of the peripheral edge portion of the electrostatic chuck 402 and the upper surface 403a of the support 403 (hereinafter, the upper surface 402a and the upper surface 403a may be referred to as "annular member support surface of the wafer support 400") by the transfer arm 71.

Next, all the lifters 405 are raised, and the cover ring Ca supporting the edge ring Fa is delivered from the transfer arm 71 to the lifters 405. Specifically, all the lifters 405 are raised, and first, the upper end portion of each lifter 405 comes into contact with the bottom surface of the cover ring Ca held by the transfer arm 71. When the lifters 405 are continuously raised even after the contact, the cover ring Ca supporting the edge ring is delivered to and supported by the lifters 405.

Moreover, the transfer arm 71 is extracted (retracted) from the plasma processing chamber 100, and then the lifters 405 are lowered. Accordingly, the cover ring Ca supporting the edge ring Fa is placed on the annular member support surface of the wafer support 400.

With the above procedure, a series of processes of placing the cover ring Ca supporting the edge ring Fa is completed.

Next, an example of a process of removing the cover ring Ca supporting the edge ring Fa, which is performed using the plasma processing system 1a, will be described. Moreover, the following process is performed under the control of the control device 80.

First, all the lifters 405 are raised, and the cover ring Ca supporting the edge ring Fa is delivered to the lifters 405 from the annular member support surface of the wafer support 400. Thereafter, the lifters 405 are continuously raised, and the cover ring Ca supporting the edge ring Fa moves upward.

Next, in the plasma processing system 1a, the transfer arm 71 is inserted from the transfer module 50 having the vacuum atmosphere into the pressure-reduced plasma processing chamber 100 through the loading/unloading port (not illustrated). Then, the transfer arm 71 is moved to a space between the annular member support surface of the wafer support 400 and the cover ring Ca supporting the edge ring Fa.

Subsequently, the lifters 405 are lowered, and the cover ring Ca supporting the edge ring Fa is delivered from the lifters 405 to the transfer arm 71. Thereafter, the transfer arm 71 is extracted from the plasma processing chamber 100, and the cover ring Ca supporting the edge ring Fa is extracted from the processing module 60. Then, the cover ring Ca that supports the edge ring Fa is stored in the storage module 62 by the transfer arm 71.

With the above procedure, a series of processes of removing the cover ring Ca supporting the edge ring Fa is completed.

Next, an example of a process of removing the edge ring Fa alone, which is performed using the plasma processing system 1a, will be described with reference to FIGS. 16 to 21. Moreover, the following process is performed under the control of the control device 80. Further, a jig J is used in the process of placing the edge ring Fa alone. The jig J is configured to support only the edge ring Fa without supporting the cover ring Ca. For example, the jig J is a plate-shaped member having a portion longer than an inner diameter of the edge ring Fa and shorter than an inner diameter of the cover ring Ca. Specifically, for example, the jig J may be an approximately rectangular plate-shaped member having a diagonal line longer than the inner diameter of the edge ring Fa and shorter than the inner diameter of the cover ring Ca in a plan view, or may be a disk-shaped member having a diameter longer than the inner diameter of the edge ring Fa and shorter than the inner diameter of the cover ring Ca.

Figure 16:
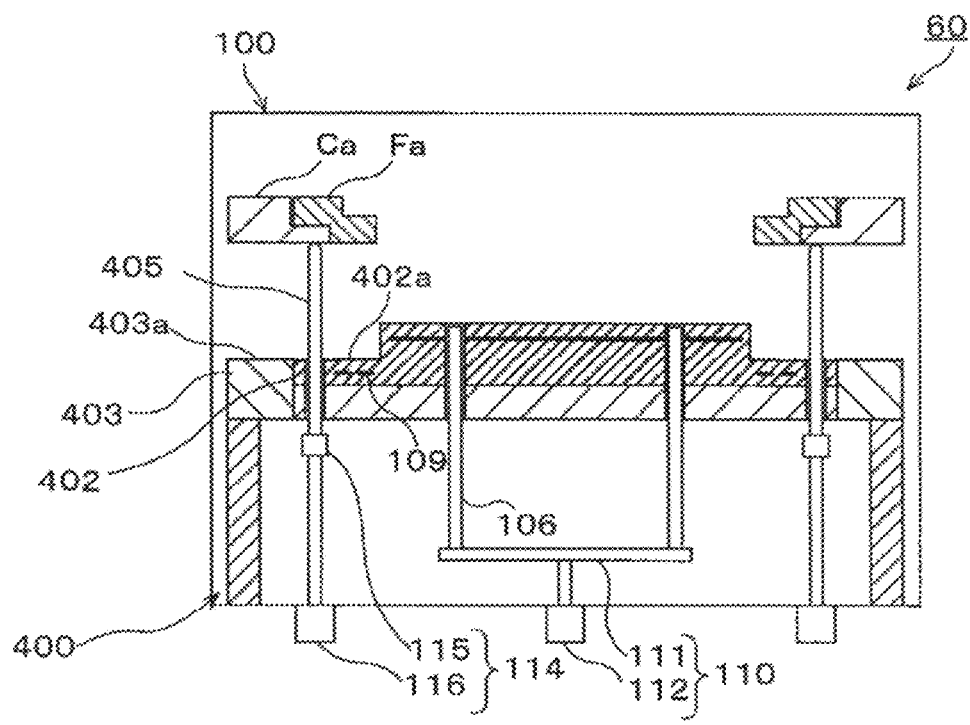
FIG. 16 is a view schematically illustrating a state in a processing module during a process of removing an edge ring alone.

In the process of removing the edge ring Fa alone, first, all the lifters 405 are raised, and the cover ring Ca supporting the edge ring Fa is delivered from the upper surface 402a of the peripheral edge portion of the electrostatic chuck 402 and the upper surface 403a of the support 403 (that is, the annular member support surface of the wafer support 400) to the lifters 405. Thereafter, the lifters 405 are continuously raised, and the cover ring Ca supporting the edge ring Fa moves upward as illustrated in FIG. 16.

Figure 17:
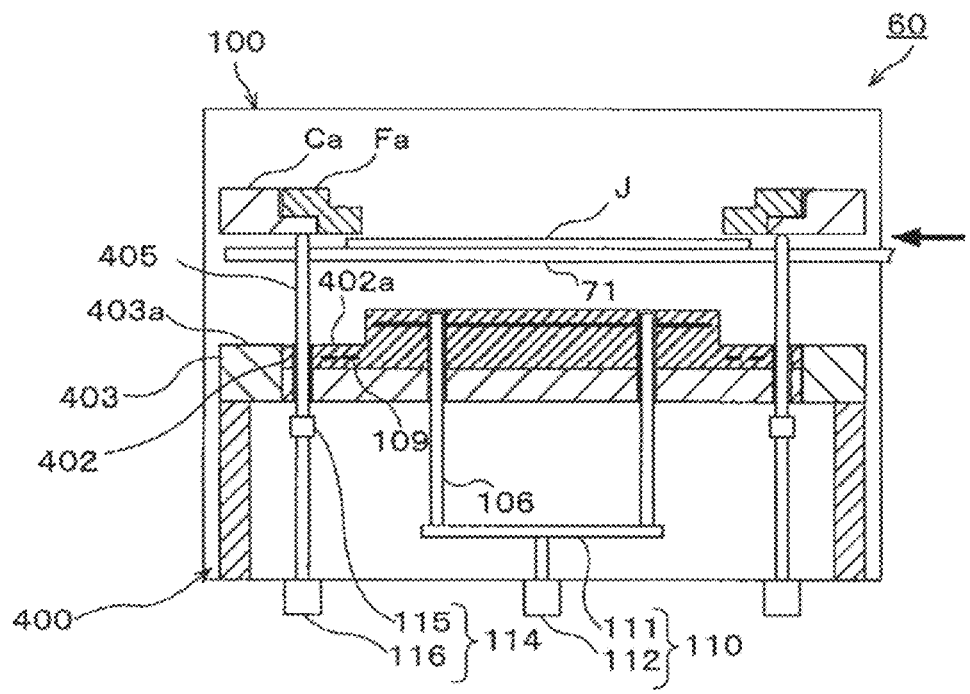
FIG. 17 is a view schematically illustrating a state in the processing module during the process of removing the edge ring alone.

Next, in the plasma processing system 1, the transfer arm 71 that holds and extracts the jig J from the processing module 60 is inserted from the transfer module 50 having the vacuum atmosphere into the pressure-reduced plasma processing chamber 100 through the loading/unloading port (not illustrated). Then, as illustrated in FIG. 17, the jig J held by the transfer arm 71 is moved to a space between the cover ring Ca supporting the edge ring Fa and the annular member support surface of the wafer support 400 (i.e., the upper surface 402a of the peripheral edge portion of the electrostatic chuck 402 and the upper surface 403a of the support 403).

Figure 18:
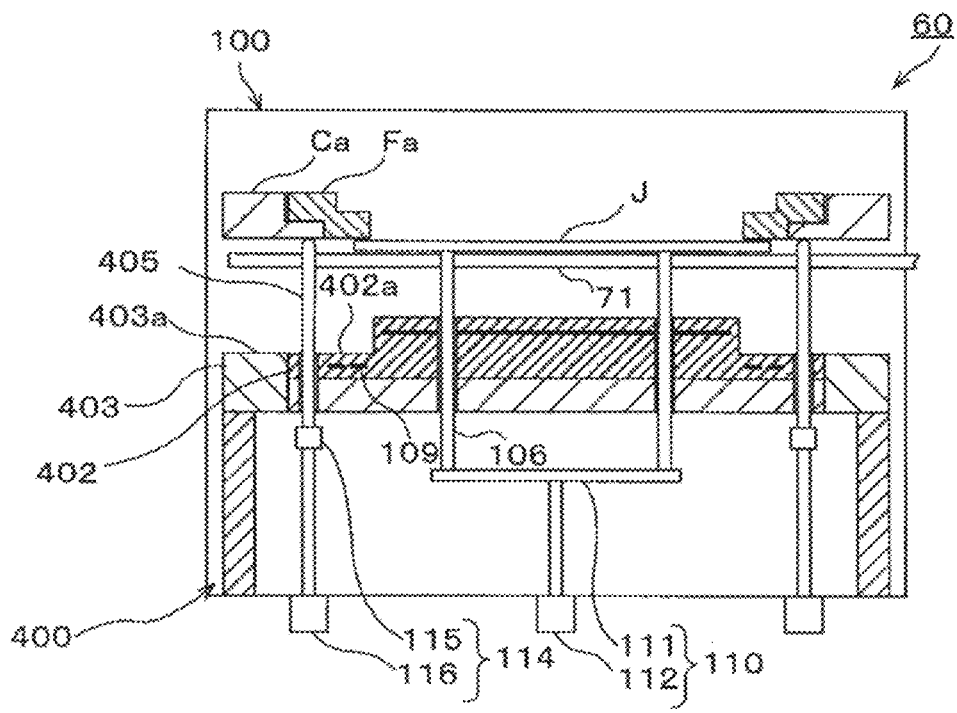
FIG. 18 is a view schematically illustrating a state in the processing module during the process of removing the edge ring alone.

Subsequently, the elevating pins 106, which are an example of the lifters for the wafer W, are raised, and the jig J is delivered from the transfer arm 71 to the elevating pins 106 as illustrated in FIG. 18.

Figure 19:
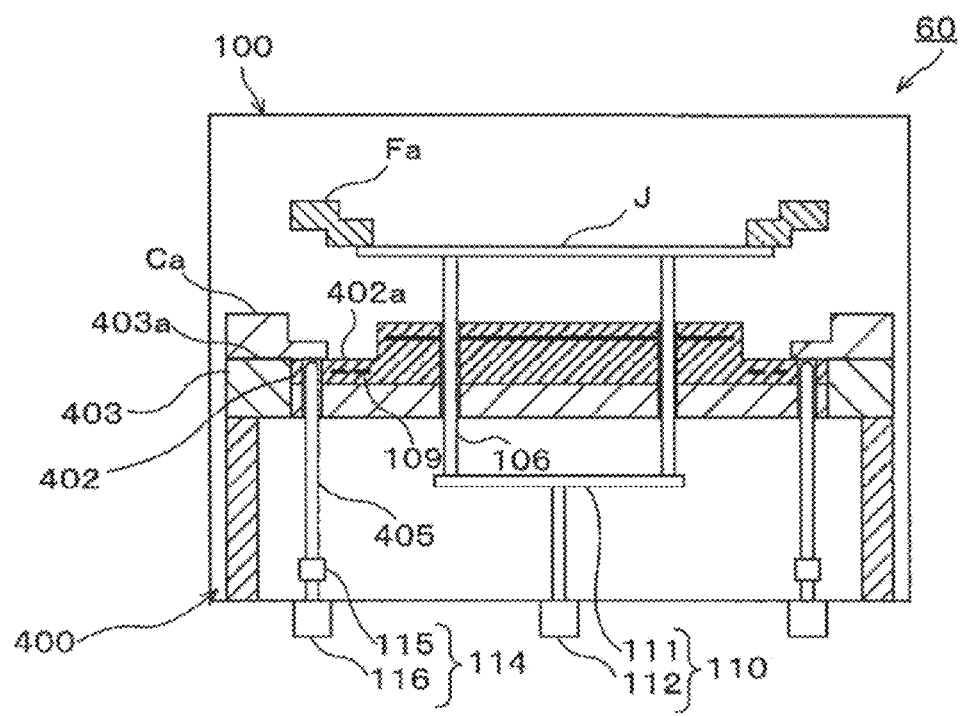
FIG. 19 is a view schematically illustrating a state in the processing module during the process of removing the edge ring alone.

Next, the transfer arm 71 is extracted (retracted) from the plasma processing chamber 100, and then the lifters 405 and the elevating pins 106 are relatively moved with each other, and specifically, only the lifters 405 are lowered. As a result, as illustrated in FIG. 19, the edge ring Fa is delivered from the cover ring Ca to the jig J. Thereafter, only the lifters 405 are continuously lowered, and thus, the cover ring Ca is delivered from the lifters 405 to the annular member support surface.

Figure 20:
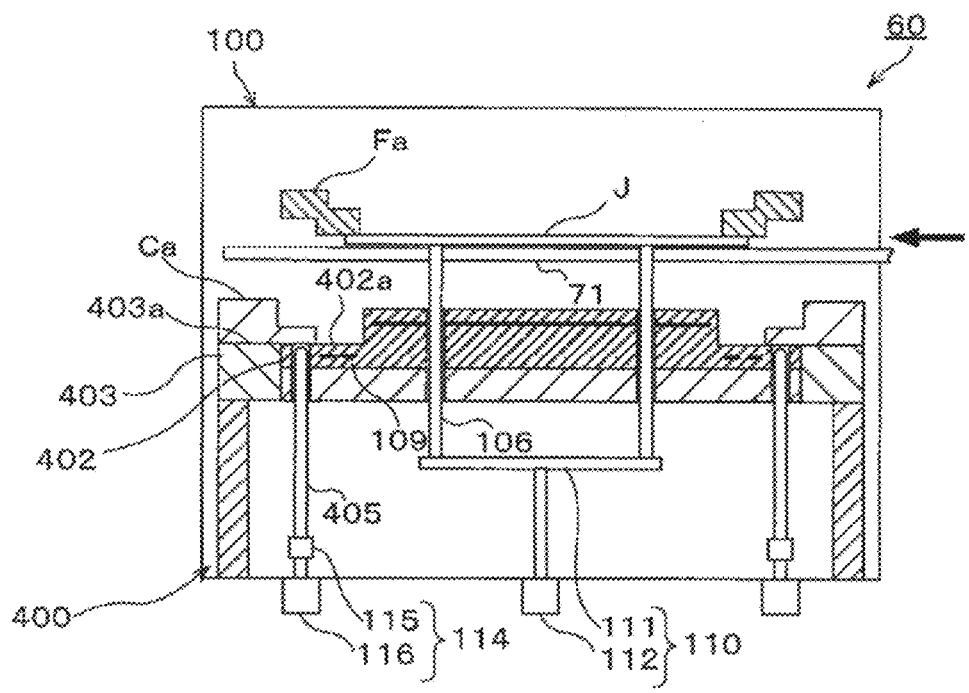
FIG. 20 is a view schematically illustrating a state in the processing module during the process of removing the edge ring alone.

Next, the transfer arm 71 is inserted into the plasma processing chamber 100 through the loading/unloading port (not illustrated). Then, as illustrated in FIG. 20, the transfer arm 71 is moved to a space between the cover ring Ca and the jig J that supports the edge ring Fa.

Figure 21:
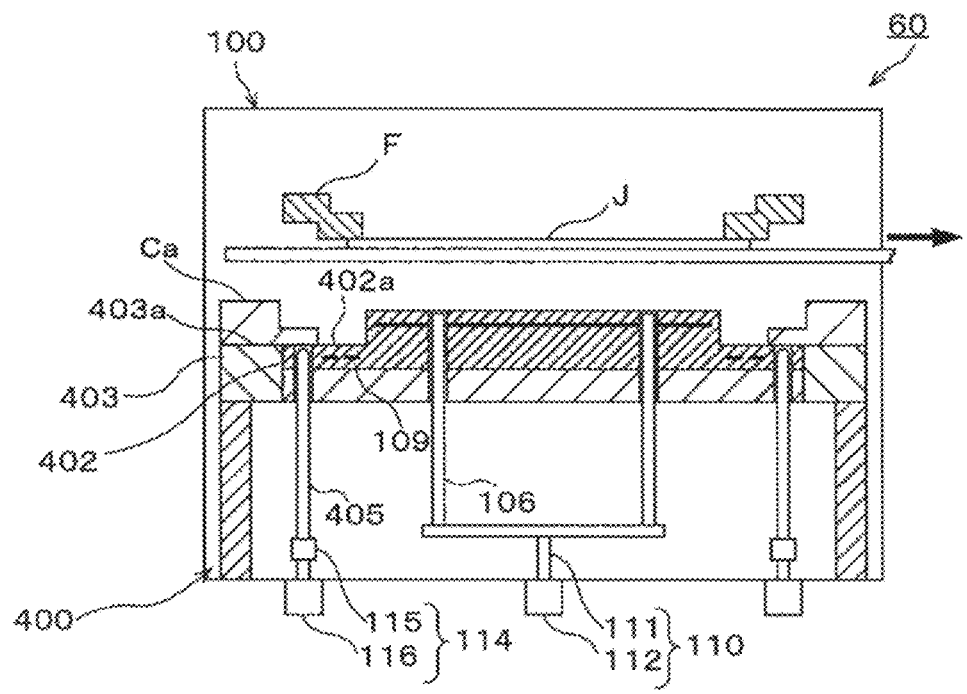
FIG. 21 is a view schematically illustrating a state in the processing module during the process of removing the edge ring alone.

Subsequently, the elevating pins 106 are lowered, and as illustrated in FIG. 21, the jig J supporting the edge ring Fa is delivered from the elevating pins 106 to the transfer arm 71.

Then, the transfer arm 71 is extracted from the plasma processing chamber 100, and the jig J supporting the edge ring Fa is unloaded from the plasma processing chamber 100. The jig J that supports the edge ring Fa is stored in the storage module 62 by the transfer arm 71.

With the above procedure, a series of processes of removing the edge ring Fa alone is completed.

Next, an example of a process of placing the edge ring Fa alone, which is performed using the plasma processing system 1a, will be described. Moreover, the following process is performed under the control of the control device 80. Further, as described below, the jig J is also used in the process of placing the edge ring Fa alone as in the process of removing the edge ring Fa alone.

Figure 22:
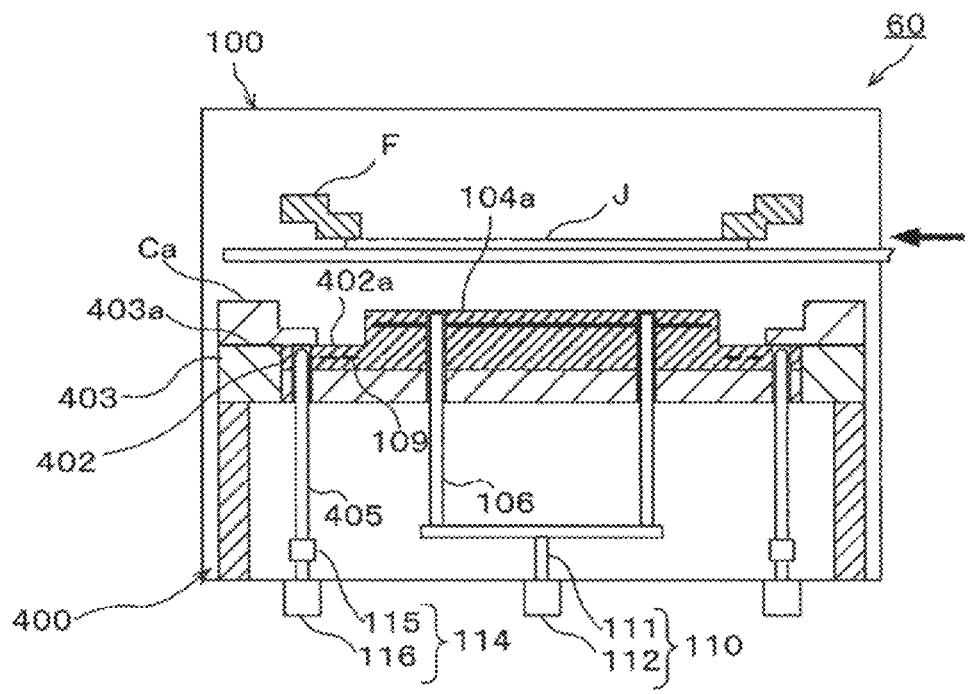
FIG. 22 is a view schematically illustrating a state in the processing module during a process of removing a cover ring supporting the edge ring.

First, in the plasma processing system 1a, the jig J supporting the edge ring Fa is held by the transfer arm 71 of the transfer module 50 having the vacuum atmosphere and extracted from the storage module 62. Next, the transfer arm 71 that holds the jig J supporting the edge ring Fa is inserted into the pressure-reduced plasma processing chamber 100 of the processing module 60 that is the placement target through the loading/unloading port (not illustrated). Then, as illustrated in FIG. 22, the jig J supporting the edge ring Fa is transferred above the upper surface 104a of the central portion of the electrostatic chuck 402, by the transfer arm 71.

Figure 23:
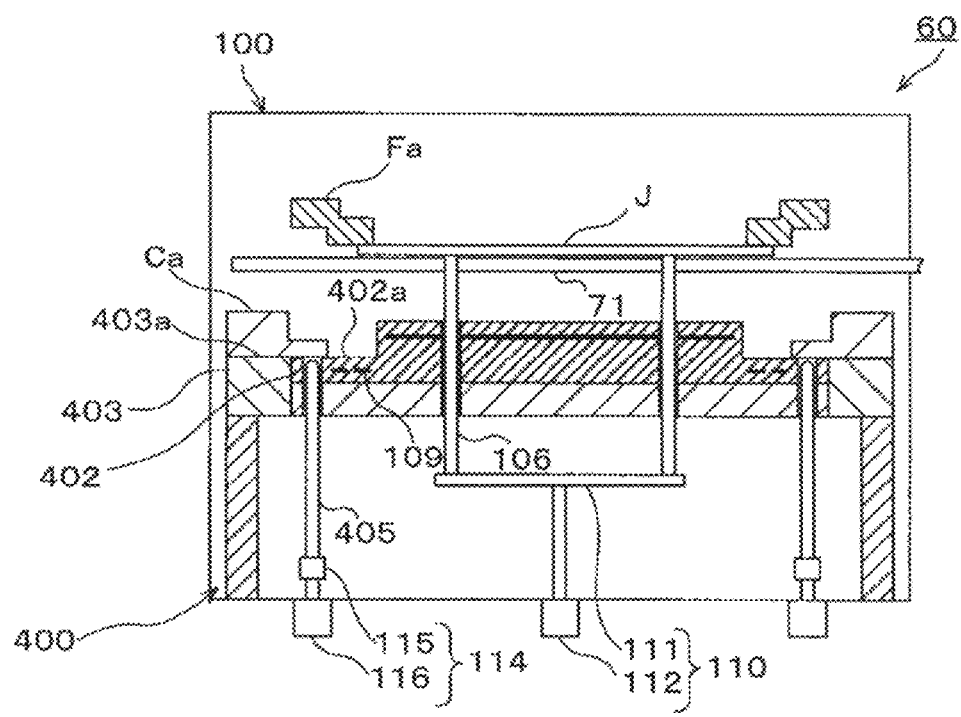
FIG. 23 is a view schematically illustrating a state in the processing module during the process of removing the cover ring supporting the edge ring.

Next, the elevating pins 106 are raised, and the jig J supporting the edge ring Fa is delivered from the transfer arm 71 to the elevating pins 106 as illustrated in FIG. 23.

Figure 24:
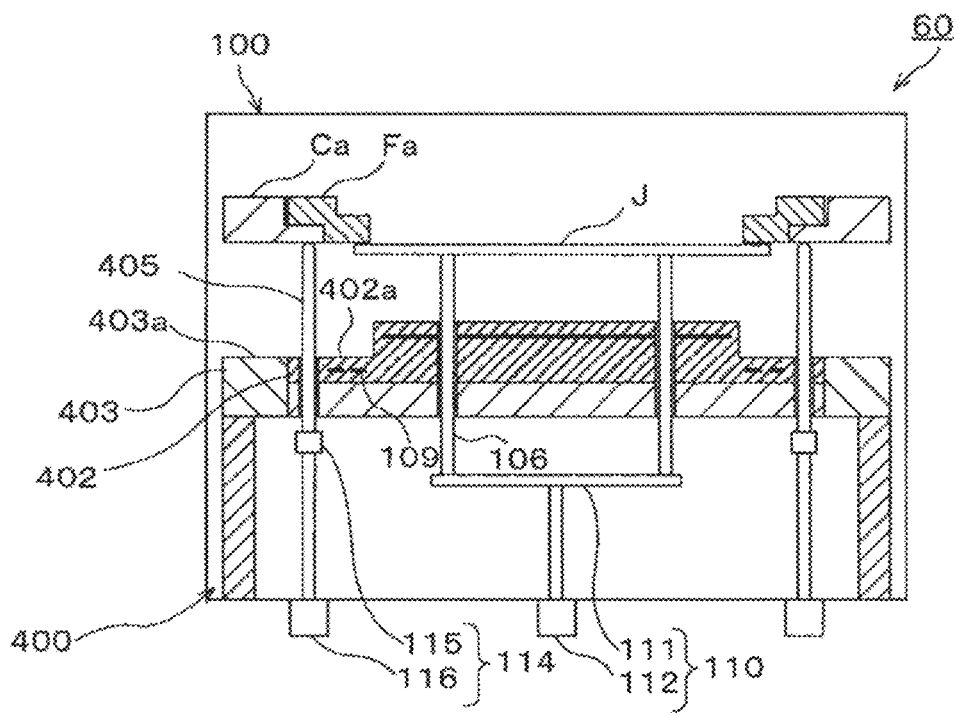
FIG. 24 is a view schematically illustrating a state in the processing module during the process of removing the cover ring supporting the edge ring.

Subsequently, the transfer arm 71 is extracted (retracted) from the plasma processing chamber 100, and then the lifters 405 that supports only the cover ring Ca are raised. Accordingly, as illustrated in FIG. 24, the edge ring Fa is delivered from the jig J on the elevating pins 106 to the cover ring Ca.

Figure 25:
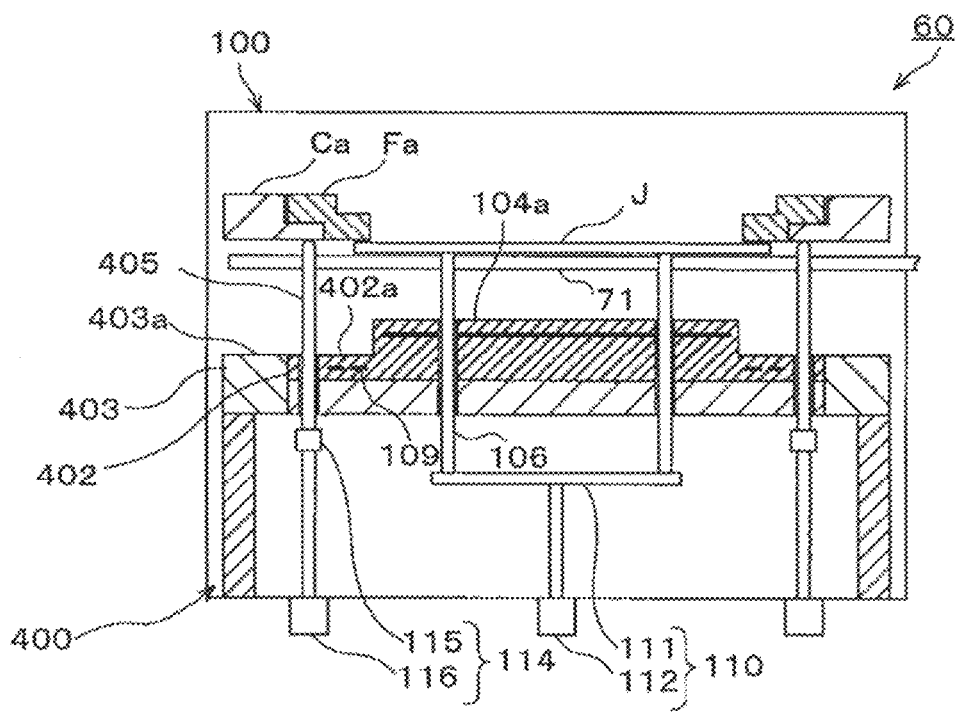
FIG. 25 is a view schematically illustrating a state in the processing module during the process of removing the cover ring supporting the edge ring.
Figure 26:
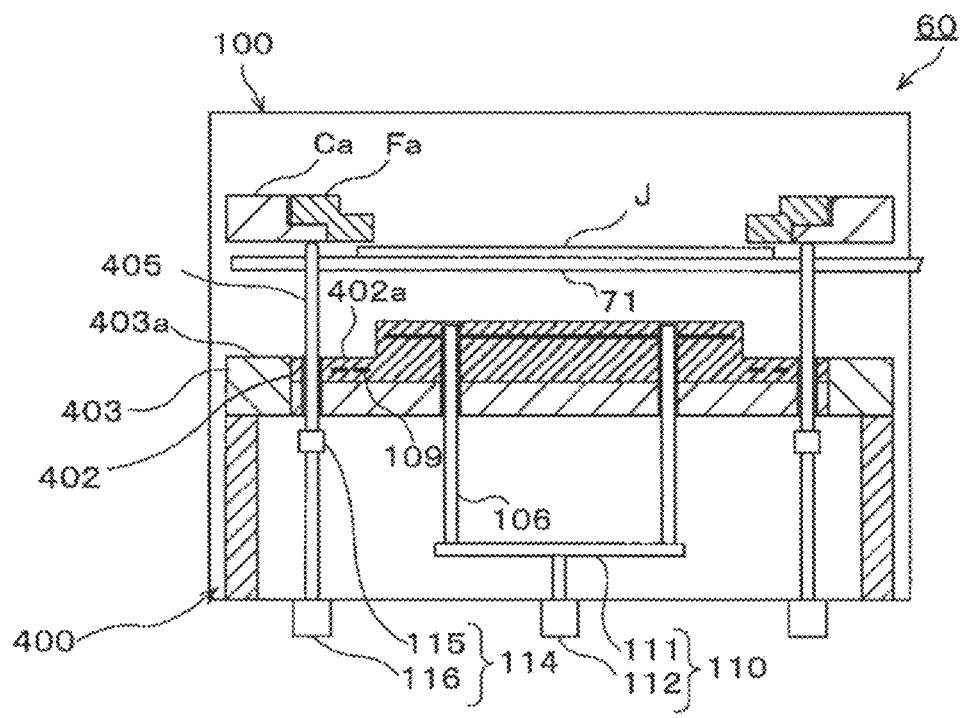
FIG. 26 is a view schematically illustrating a state in the processing module during the process of removing the cover ring supporting the edge ring.
Figure 27:
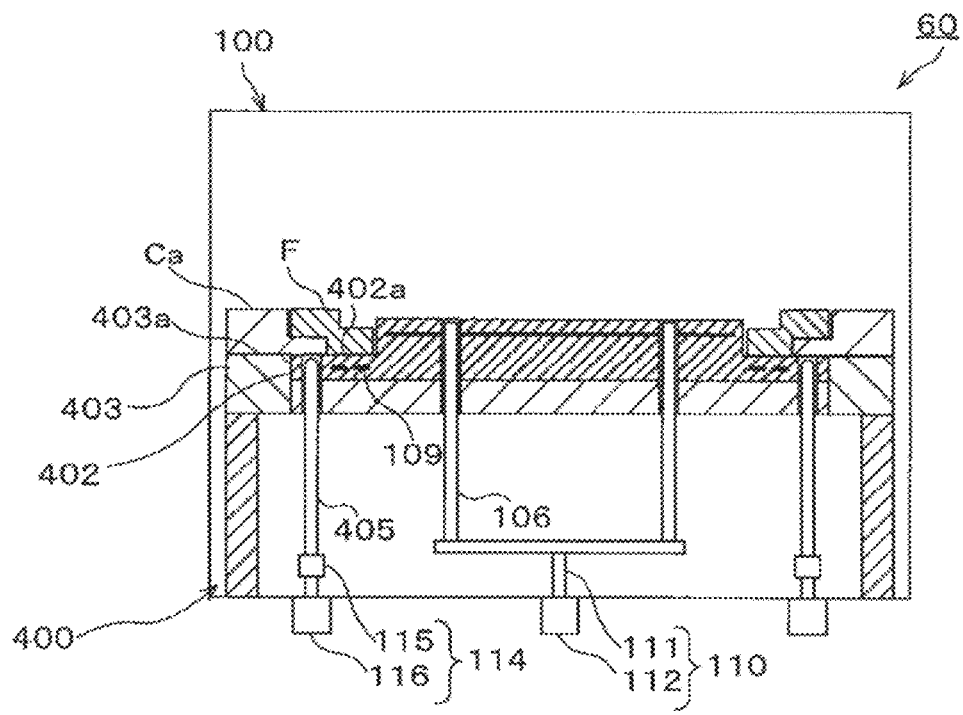
FIG. 27 is a view schematically illustrating a state in the processing module during the process of removing the cover ring supporting the edge ring.

Next, the transfer arm 71 is inserted into the plasma processing chamber 100 again through the loading/unloading port (not illustrated). Then, as illustrated in FIG. 25, the transfer arm 71 is moved to a space between the upper surface (that is, the substrate support surface) 104a of the central portion of the electrostatic chuck 402 and the jig J.

Subsequently, the elevating pins 106 are lowered, and the jig J that does not support the edge ring Fa is delivered from the elevating pins 106 to the transfer arm 71.

Then, the transfer arm 71 is extracted from the plasma processing chamber 100, and the jig J is unloaded from the plasma processing chamber 100. The jig J is stored in the storage module 62 by the transfer arm 71.

Further, the lifters 405 are lowered, and as a result, the cover ring Ca supporting the edge ring Fa is placed over the upper surface 402a of the peripheral edge portion of the electrostatic chuck 402 and the upper surface 403a of the support 403.

With the above procedure, a series of processes of placing the edge ring Fa alone is completed.

As described above, according to the fourth exemplary embodiment, when the edge ring Fa is replaced in the plasma processing system 1a in which both the edge ring Fa and the cover ring Ca are used, the replacement in the state where the edge ring Fa is supported by the cover ring Ca and the replacement of the edge ring alone can be selectively performed. Further, according to the fourth exemplary embodiment, the edge ring Fa can be replaced in the state where the edge ring Fa is supported by the cover ring Ca, that is, the edge ring Fa and the cover ring Ca can be replaced at the same time. Accordingly, the time required for replacement can be further shortened. Further, since it is not necessary to provide a mechanism for raising and lowering the edge ring Fa, costs can be reduced. Further, according to the present embodiment, when the cover ring Ca does not need to be replaced and only the edge ring Fa needs to be replaced, only the edge ring Fa can be replaced even if a mechanism for directly raising and lowering the edge ring Fa is not provided.

Moreover, at least one of the cover ring Ca supporting the edge ring Fa and the jig J may be stored in a container placed on the load port 32.

In addition, the edge ring is an example of a first annular member, and the cover ring is an example of a second annular member. The first annular member is an annular member disposed to surround the substrate placed on the wafer support, and the second annular member is an annular member formed to at least partially overlap the first annular member in a plan view. More specifically, the second annular member is configured to support the first annular member, and is formed to at least partially overlap the first annular member in a plan view. For example, the second annular member supports the first annular member in a state where the first annular member is substantially concentric with the second annular member.

In the above, the technique according to the embodiments is described with an example using the edge ring and the cover ring, but the technique according to the embodiments can be applied to any plasma processing system using the first annular member and the second annular member.

By applying the technique according to the embodiments to the plasma processing system using the first annular member and the second annular member, when the first annular member is replaced, a replacement in a state where the first annular member is supported by the second annular member and a replacement of the first annular member alone can be selectively performed.

While various embodiments have been described above, various omissions, substitutions, and changes may be made without being limited to the above-described embodiments. Further, other embodiments can be implemented by combining elements in different embodiments.

In addition to the above-described embodiments, the following additional notes will be further disclosed.

APPENDIX 1

A substrate support includes:
a substrate support surface on which a substrate is placed;

an annular member support surface on which an annular member, which is disposed to surround the substrate placed on the substrate support surface, is placed;

three or more elevating pins configured to protrude beyond the annular member support surface and further configured to be raised to adjust an amount of protrusion from the annular member support surface; and an elevating mechanism configured to raise or lower the elevating pins.

Further, a recess having a concave surface recessed upward is provided at a position corresponding to each of the elevating pins on a bottom surface of the annular member, and a curvature of an upper end portion of each of the elevating pins is larger than a curvature of the recess.

APPENDIX 2

In the substrate support according to Appendix 1, in a plan view, an opening of the recess is larger in size than a transfer error of the annular member above the annular member support surface.

APPENDIX 3

In the substrate support according to Appendix 1 or 2, the elevating mechanism raises and lowers the elevating pins independently.

The invention claimed is:

1. A plasma processing system, comprising:
a control device; and
a plasma processing device including:
  a processing chamber,
  a substrate support provided in the processing chamber, the substrate support including an electrostatic chuck having a central portion supporting a substrate on an upper surface thereof, a first ring positioned outside the central portion so as to surround the central portion, a second ring surrounding the first ring, and a supporter positioned below the second ring and supporting the second ring, and
  a lifter for raising and lowering the first ring and the second ring, the lifter provided inside an outermost periphery of the supporter and below the second ring, wherein
a portion of the second ring is positioned below the first ring,
the control device controls the lifter to raise the second ring so that the first ring is supported and raised by the second ring,
a protrusion is provided on one of a lower surface of the first ring and an upper surface of the second ring,
a recess, into which the protrusion is fitted, is provided on an other of the lower surface of the first ring and the upper surface of the second ring, and
the lifter is positioned radially inward of the protrusion and the recess.

2. The plasma processing system of claim 1, wherein a diameter of an innermost peripheral portion of the second ring is smaller than a diameter of an outermost peripheral portion of the first ring.

3. The plasma processing system of claim 1, wherein an inner peripheral portion of the second ring at least partially overlaps an outer peripheral portion of the first ring in a plan view.

4. The plasma processing system of claim 1, wherein the second ring covers an outer side surface of the first ring.

5. The plasma processing system of claim 1, wherein the protrusion and the recess are formed along a circumferential direction of the first ring and the second ring.

6. The plasma processing system of claim 1, wherein the first ring is an edge ring.

7. The plasma processing system of claim 6, wherein the second ring is a cover ring that covers an outer surface of the edge ring.

8. The plasma processing system of claim 1, wherein the first ring includes Si or SiC.

9. The plasma processing system of claim 1, wherein another recess is formed on a lower surface of the second ring to engage with an upper end portion of the lifter.

10. The plasma processing system of claim 1, further comprising:
a transfer device having a holder, wherein
the control device controls the transfer device to move the holder between the second ring supporting the first ring and the substrate support, and
the control device controls the lifter to lower the lifter to deliver the second ring supporting the first ring from the lifter to the holder.

11. The plasma processing system of claim 1, wherein the plasma processing device further includes another lifter which moves up and down so as to protrude from the upper surface of the central portion of the electrostatic chuck.

12. The plasma processing system of claim 11, further comprising:
a transfer device having a holder which supports a jig, the jig having a portion longer than an inner diameter of the first ring.

13. The plasma processing system of claim 12, wherein the control device is configured to:
control the transfer device to move the jig supported by the holder between the second ring supporting the first ring and the substrate support,
control the another lifter to raise to deliver the jig from the holder to the another lifter,
control the lifter and the another lifter, after extracting the holder, to move relatively with each other to deliver the first ring from the second ring to the jig,
control the lifter to lower to deliver the second ring from the lifter to the supporter,
controls the transfer device to move the holder between the second ring and the jig supporting the first ring, and then control the another lifter to lower to deliver the jig supporting the first ring from the another lifter to the holder, and
control the transfer device to extract the holder from the processing chamber to deliver the jig supporting the first ring from the processing chamber.

14. The plasma processing system of claim 12, wherein the control device is further configured to:
control the transfer device to move the jig, which supports the first ring and is supported by the holder, above the substrate support,
control the another lifter to raise to deliver the jig supporting the first ring from the holder to the another jig,
control the lifter, after extracting the holder, to raise while supporting only the second ring to deliver the first ring from the jig to the second ring,
control the transfer device to move the holder between the substrate support and the jig, and then control the another lifter to lower to deliver the jig from the another lifter to the holder, control the transfer device to extract the holder from the processing chamber to deliver the jig from the processing chamber, and control the lifter to lower the lifter to deliver the second ring.

15. A substrate support, comprising:

an electrostatic chuck having a central portion supporting a substrate on an upper surface thereof;

a first ring positioned outside the central portion so as to surround the central portion;

a second ring surrounding the first ring, a portion the second ring being positioned below the first ring;

a supporter positioned below the second ring and supporting the second ring; and a lifter for raising and lowering the first ring and the second ring, the lifter being provided inside an outermost periphery of the supporter and below the second ring, wherein the lifter protrudes from the supporter, the lifter raises the second ring so that the first ring is supported and raised by the first second ring when raised, a protrusion is provided on one of a lower surface of the first ring and an upper surface of the second ring, a recess, into which the protrusion is fitted, is provided on an other of the lower surface of the first ring and the upper surface of the second ring, and the lifter is positioned radially inward of the protrusion and the recess.

16. The substrate support of claim 15, wherein a diameter of an innermost peripheral portion of the second ring is smaller than a diameter of an outermost peripheral portion of the first ring.

17. The substrate support of claim 15, wherein an inner peripheral portion of the second ring at least partially overlaps an outer peripheral portion of the first ring in a plan view.

18. The substrate support of claim 15, wherein the second ring covers an outer side surface of the first ring.

19. The substrate support of claim 15, wherein the protrusion and the recess are formed along a circumferential direction of the first ring and the second ring.

20. The substrate support of claim 15, wherein the first ring is an edge ring.

21. The substrate support of claim 20, wherein the second ring is a cover ring that covers an outer surface of the edge ring.

22. The substrate support of claim 15, wherein the first ring includes Si or SiC.

23. The substrate support of claim 15, wherein a recess is formed on a lower surface of the second ring to engage with an upper end portion of the lifter.

24. The substrate support of claim 15, further comprising another lifter which moves up and down so as to protrude from the upper surface of the central portion of the electrostatic chuck.

* * * * *